United States Patent [19]
Ohsaki

[11] Patent Number: 6,038,013
[45] Date of Patent: Mar. 14, 2000

[54] VIBRATION ISOLATOR AND EXPOSURE APPARATUS

[75] Inventor: Tatsuya Ohsaki, Kawasaki, Japan

[73] Assignee: Nikon Corporation, Tokyo, Japan

[21] Appl. No.: 08/904,268

[22] Filed: Jul. 31, 1997

[30] Foreign Application Priority Data

Oct. 4, 1996 [JP] Japan .................................. 8-283187

[51] Int. Cl.$^7$ ............................ G03B 27/42; F16M 13/00
[52] U.S. Cl. ............................ 355/53; 356/400; 248/550; 248/638
[58] Field of Search ............................. 355/53, 72, 75; 396/53, 55; 356/375, 399, 400, 401; 248/550, 638; 73/662

[56] References Cited

U.S. PATENT DOCUMENTS

| | | | |
|---|---|---|---|
| 4,558,949 | 12/1985 | Uehara et al. | 356/152 |
| 4,650,983 | 3/1987 | Suwa | 250/204 |
| 4,780,617 | 10/1988 | Umatate et al. | 250/548 |
| 5,172,160 | 12/1992 | Eijk et al. | 355/53 |
| 5,187,519 | 2/1993 | Takabayashi et al. | 355/53 |
| 5,446,519 | 8/1995 | Makinouchi | 355/53 |
| 5,610,686 | 3/1997 | Osanai | 355/53 |
| 5,767,948 | 6/1998 | Loopstra et al. | 355/53 |
| 5,812,420 | 9/1998 | Takahashi | 355/53 |

*Primary Examiner*—Alan A. Mathews
*Attorney, Agent, or Firm*—Morgan, Lewis & Bockius LLP

[57] ABSTRACT

An apparatus that performs an efficient actuator control operation without generation of excess heat by the actuators is described. The control mode of the exposure apparatus main body part is set in accordance with the apparatus operating mode by a target value output part, and actuators are controlled by a control device on the basis of the outputs of displacement sensors and vibration sensors in accordance with the set control mode, thus effecting vibration control and position control of the exposure apparatus main body. Accordingly, an efficient actuator control operation corresponding to the operating mode of the moving body is possible, and unnecessary driving of the actuators can be avoided.

66 Claims, 8 Drawing Sheets

VIBRATION ISOLATOR AND EXPOSURE APPARATUS

This application claims the benefit of Japanese Application No. 8-283187, filed on Oct. 4, 1996, which is hereby incorporated by reference.

BACKGROUND OF THE INVENTION

1. Field of the Invention

The present invention relates to a vibration isolator and a vibration isolator in combination with an exposure apparatus. More specifically the present invention relates to a so-called "active type" vibration isolator in which a vibration isolating stand is driven by actuators so that the vibration of the vibration isolating stand is canceled, and also an exposure apparatus that is equipped with the vibration isolator.

2. Discussion of the Related Art

As precision requirements have increased in high-precision instruments, such as step-and-repeat-type reducing projection exposure devices (so-called "steppers"), it has become necessary to isolate micro-vibrations acting on the base plate (vibration isolating stand) of such devices from the installation floor at the micro-G level. Various types of dampers, such as mechanical dampers, in which compression coil springs are placed in a damping liquid and pneumatic dampers, have been used as vibration isolating pads that support the vibration isolating stand. The vibration isolating pads also are capable of performing some centering functions, especially in air spring vibration isolators equipped with pneumatic dampers, wherein the spring constant can be set at a small value so that vibrations exceeding approximately 10 Hz or higher can be isolated. Accordingly, such vibration isolators are widely used for the support of precision instruments. Recently, active vibration isolators have been proposed in order to break through the limits inherent in passive vibration isolators. The active vibration isolators are vibration isolators in which the vibration of the vibration isolating stand is detected by sensors and vibration control is accomplished by driving actuators on the basis of the output of the sensors. Such vibration isolators are capable of producing an ideal vibration isolating effect with no resonance peak in the low-frequency control region.

In steppers, an XY-stage (wafer stage), which undergoes a large acceleration and deceleration, is mounted on a base plate held by vibration isolating pads. The center of gravity of the main body of the exposure apparatus moves simultaneously with the movement of the XY-stage. In an active type vibration isolator, when the position of the center of gravity of the main body changes as a result of the movement of the wafer stage, the initial positioning is performed by means of a position control loop. If the amount of movement of the stage is large, the corresponding change in the position of the center of gravity of the main body also is large, so that the main body experiences tilting. The amount of this inclination increases with an increase in the amount of change in the position of the center of gravity of the main body, so that the driving force required in the actuators in order to correct this is also increased. In active vibration isolators used in conventional exposure apparatus, the output values of the respective displacement sensors obtained when the respective stages, i.e., wafer X-stage, wafer Y-stage, and in scan-type exposure apparatus, the reticle stage; used for the target setting values, are used in order to correct the inclination of the base plate (vibration isolating stand) and limit vibration. Furthermore, the target setting ranges are uniformly set on the basis of permissible values with six degrees of freedom at the emission position of the light exposure source and the receiving positions of the reticle and wafer loader.

The amount of heat generated by the actuators in the vibration isolator is especially large when the main body is tilted, so that the environment in which the exposure apparatus is placed undergoes a large temperature variation. This temperature variation in the environment has an effect on the measurement precision of the laser interferometers that measure the position of the XY-stage. The temperature variation therefore leads to a deterioration in the stage positioning precision.

SUMMARY OF THE INVENTION

Accordingly, the present invention is directed to a vibration isolator and exposure apparatus that substantially obviates one or more of the problems due to limitations and disadvantages of the related art.

An object of the present invention is to provide a vibration isolator that allows efficient actuator control operation and prevents the unnecessary generation of heat by the actuators.

Another object of the present invention is to provide a reduction in the generation of heat by the actuators.

A further object of the present invention is to provide a superior exposure apparatus employing a vibration isolator in which an efficient actuator control operation is performed in accordance with the operating mode of the substrate stage, so that changes in the ambient temperature caused by the unnecessary generation of heat by the actuators can be suppressed.

To achieve these and other advantages and in accordance with the purpose of the present invention, as embodied and broadly described, the vibration isolator and exposure apparatus includes a vibration isolating stand that is held in a substantially horizontal position via at least three vibration isolating pads, a moving body that moves across the vibration isolating stand, a plurality of actuators that drive the vibration isolating stand, displacement sensors that detect the displacement of the vibration isolating stand, vibration sensors that detect the vibration of the vibration isolating stand, a setting means that sets the control mode of the vibration isolating stand in accordance with the operating mode of the moving body, and a first control system that controls the plurality of actuators on the basis of the outputs of the displacement sensors and vibration sensors in accordance with the control mode.

The control mode of the vibration isolating stand is set by the setting means in accordance with the operating mode of the moving body. The first control system performs vibration control and position control of the vibration isolating stand by controlling the plurality of actuators on the basis of the outputs of the displacement sensors and vibration sensors in accordance with the set control mode of the vibration isolating stand.

The "operating mode" of the moving body refers to a mode that is suited to the object of the operation of the moving body. For example, in cases where the moving body is to be positioned in a prescribed position, the amount of positioning error that is allowed in judging this positioning to be set and the length of time for which the set state must be maintained, vary according to the object of the operation of the moving body, so that the positioning error is influenced by the target values and permissible error ranges of the vibration control, position control, and attitude control of the vibration isolating stand.

The "control mode" of the vibration isolating stand refers to the mode used to control the vibration of the vibration isolating stand. This is set in accordance with the operating mode of the moving body that moves across the surface of the vibration isolating stand. Consideration is given to the fact that more efficient vibration control of the vibration isolating stand and control of the actuators is possible if the target values and permissible error ranges in the directions of the respective degrees of freedom, in cases where the vibration of the vibration isolating stand is controlled with multiple degrees of freedom, are set at different values.

Accordingly, the present invention allows efficient control of the actuators in accordance with the operating mode of the moving body as compared to cases where the target setting values and target setting ranges of vibration control and position control of the vibration isolating stand are uniformly set as in a conventional method. Furthermore, the setting time of the positioning can also be adjusted to a suitable time for the operating mode. Moreover, in cases where the permissible vibration error is large, in accordance with the operating mode, the apparatus is set in a control mode such that the target setting ranges are broad. Accordingly, unnecessary driving of the actuators can be avoided so that unnecessary generation of heat by the actuators can be prevented.

Any desired modes may be set as the operating modes of the moving body, as long as these modes can be set under conditions such as those described above. For example, the operating modes of the moving body may include a first mode in which only the target setting ranges, of the target setting values, and setting ranges can be altered and a second mode in which both the target setting values and setting ranges can be altered. Prescribed characteristic values, e. g., values such that the target setting values in the directions of all of a multiple number of degrees of freedom are zero, may be set as the target setting values in the first mode.

In another aspect, the vibration isolator includes actuators that drive the vibration isolating stand in the vertical direction at different places. The vibration isolator further has a second control system that has air pressure control circuits that control the flow rate of air supplied to the vibration isolating pads, and which corrects at least a portion of the inclination of the isolating stand occurring as a result of the movement of the moving body by driving the air pressure control circuits on the basis of the outputs of the displacement sensors.

Thus, in addition to an efficient control operation suited to the operating mode of the moving body being ensured by the setting of the control mode, the air pressure control circuits are driven by the second control system on the basis of the outputs of the displacement sensors where the vibration isolating stand is tilted as a result of the movement of the moving body. Thus, all or part of the inclination of the vibration isolating stand caused by the movement of the moving body is corrected. Accordingly, even if the operating mode of the moving body is in the first mode and the characteristic values are set at their target setting values, the amount of correction performed by the actuators for driving the vibration isolating stand in the vertical direction that is required in order to return the vibration isolating stand to its original attitude can be greatly reduced. By reducing the amount of correction required, unnecessary generation of heat by the actuators can be prevented.

Additionally, the vibration isolation or apparatus may be designed so that if the operating mode of the moving body is the second operating mode, the setting means predicts the amount of inclination of the vibration isolating stand. The production is based on the movement command values of the moving body obtained by calculating the amount of inclination of the vibration isolating stand on the basis of the movement position of the moving body and the spring constants of the isolating pads. The target setting values are then set so that the amount of inclination of the vibration isolating stand coincides with the results of the prediction. The amount of inclination is predicted according to the movement command values of the moving body prior to the actual initiation of movement by the moving body. The target setting values (relating to the inclination of the vibration isolating stand) are set so that the amount of inclination of the vibration isolating stand agrees with the results of the prediction. There is no need for the first control system to drive the actuators for the purpose of attitude control (mainly inclination control) of the vibration isolating stand when the moving body moves to the position corresponding to the movement command values because driving of the actuators for the purpose of vibration control alone is sufficient. Accordingly, the amount of driving of the actuators can be conspicuously reduced, so that the amount of heat generated is further suppressed.

In a further aspect of the present invention, exposure apparatus exposes the image of a pattern formed in a mask R on a photosensitive substrate W via an optical projection system PL while causing the stepwise movement of a substrate stage, which holds the photosensitive substrate W. The exposure apparatus includes a vibration isolating stand that is held in a substantially horizontal position via at least three vibration isolating pads, at least one moving stage that includes the substrate stage that moves across the vibration isolating stand, a plurality of actuators that drive the vibration isolating stand, displacement sensors that detect the displacement of the vibration isolating stand, vibration sensors that detect the vibration of the vibration isolating stand, a setting means that sets the control mode of the vibration isolating stand in accordance with an apparatus operating mode relating to the movement of the substrate stage, and a control device that controls the plurality of actuators on the basis of the outputs of the displacement sensors and vibration sensors in accordance with the control mode.

The term "apparatus operating mode relating to the movement of the substrate stage" refers to various operating modes of the exposure apparatus in which the movement conditions (object of movement) of the substrate stage are different. This term is defined in the same sense as "operating mode of the moving body."

Additionally, as described in the previous aspects at the present invention, the control mode of the vibration isolating stand is set in accordance with the operating mode of the substrate stage that moves across the surface of the vibration isolating stand, with consideration being given to the fact that more efficient vibration control of the vibration isolating stand (control of the actuators) is possible if the target values and permissible error ranges in the directions of the respective degrees of freedom (in cases where the vibration of the vibration isolating stand is controlled with multiple degrees of freedom) are set at different values.

Accordingly, the present invention allows efficient control of the actuators in accordance with the operating mode of the substrate stage (as compared to the conventional method wherein the target setting values and target setting ranges of vibration control and position control of the vibration isolating stand are uniformly set). The setting time of the positioning can also be adjusted to a time that is suited to the operating mode. Where the permissible vibration error is large (in accordance with the operating mode), the apparatus is set in a control mode that is such that the target setting ranges are broad, thereby avoiding unnecessary driving of the actuators, so that temperature changes in the environment, which have an effect on the exposure precision can be suppressed.

The exposure apparatus of the present invention may be either a stationary exposure-type apparatus, such as a reduction projection-type exposure apparatus using a step-and-repeat system (i.e., a so-called "stepper"), or a scan exposure-type exposure apparatus, such as a step-and-scan type-exposure apparatus, as long as the exposure apparatus performs an exposure while causing the stepwise movement of a substrate stage holding a photosensitive substrate.

Various types of modes are conceivable as the operating modes. For example, where the apparatus has a detection means that detects marks formed on the photosensitive substrate W, the apparatus operating modes may include a first mode in which the exposure is performed after the stage is moved so that the photosensitive substrate W is positioned in a prescribed exposure position, and a second mode in which the substrate stage is moved and the alignment marks are detected by the detection means. Where, for example, the exposure light source is installed in a position separate from the vibration isolating stand and the detection means is installed on the vibration isolating stand, vibration control and attitude control of the vibration isolating stand must be performed with strict precision in the first mode.

Furthermore, the target values for vibration control and position control of the vibration isolating stand must be fixed (i.e., the target setting values in the directions of all degrees of freedom must be set at zero). In the second mode, on the other hand, the attitude control of the vibration isolating stand need not be performed with a very high precision. It is necessary to vary the target setting values in accordance with the movement position of the substrate stage. Thus, the control modes are set with consideration given to the parameters, so that efficient actuator control can be accomplished.

The apparatus operating modes may also include a third mode in which the substrate stage is moved to a prescribed receiving position in order to receive the photosensitive substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

The first embodiment of the present invention will now be described with reference to FIGS. 1 through 8.

Figure 1:
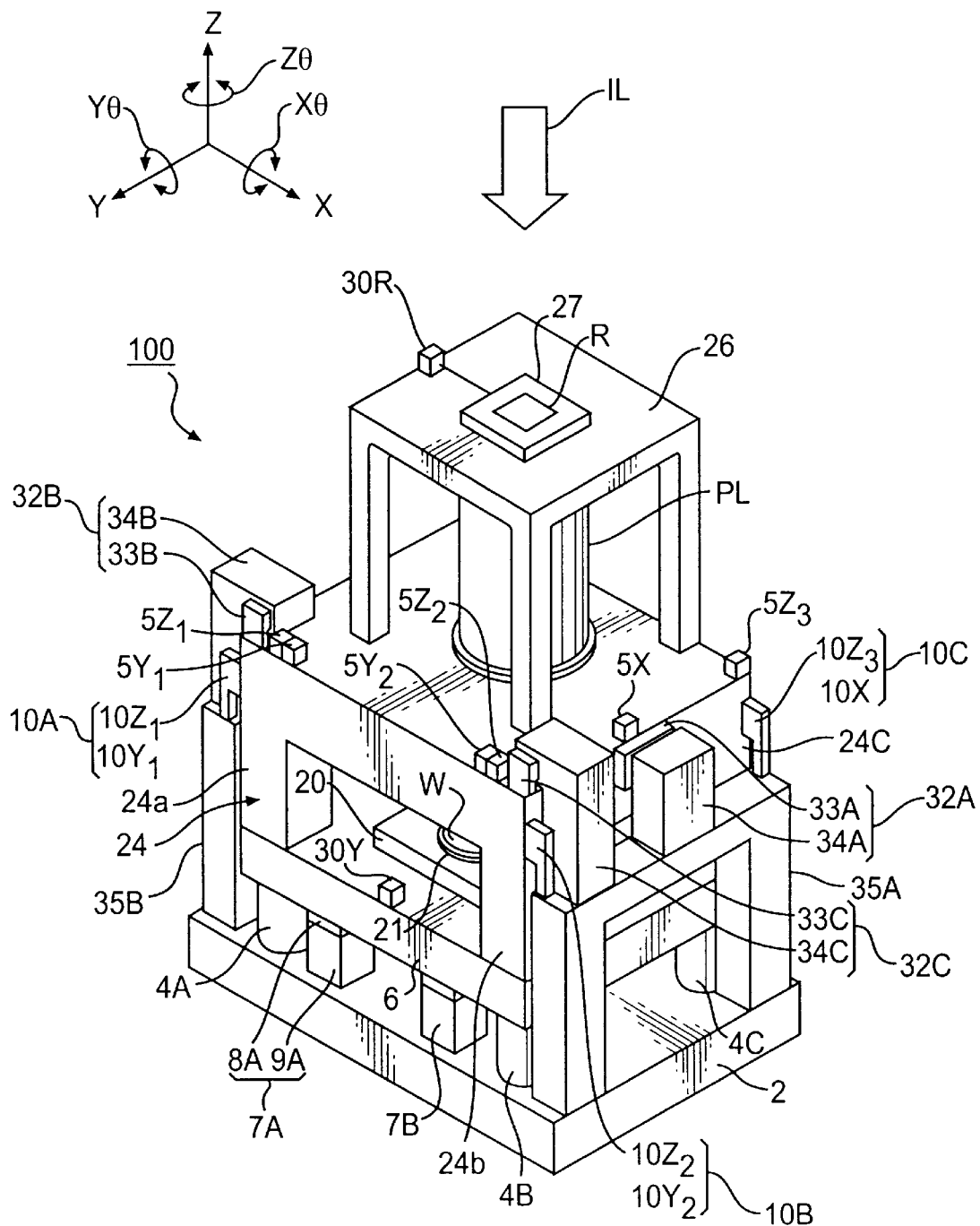
FIG. 1 is a perspective view that illustrates an exposure apparatus of the first embodiment of the present invention.
Figure 2:
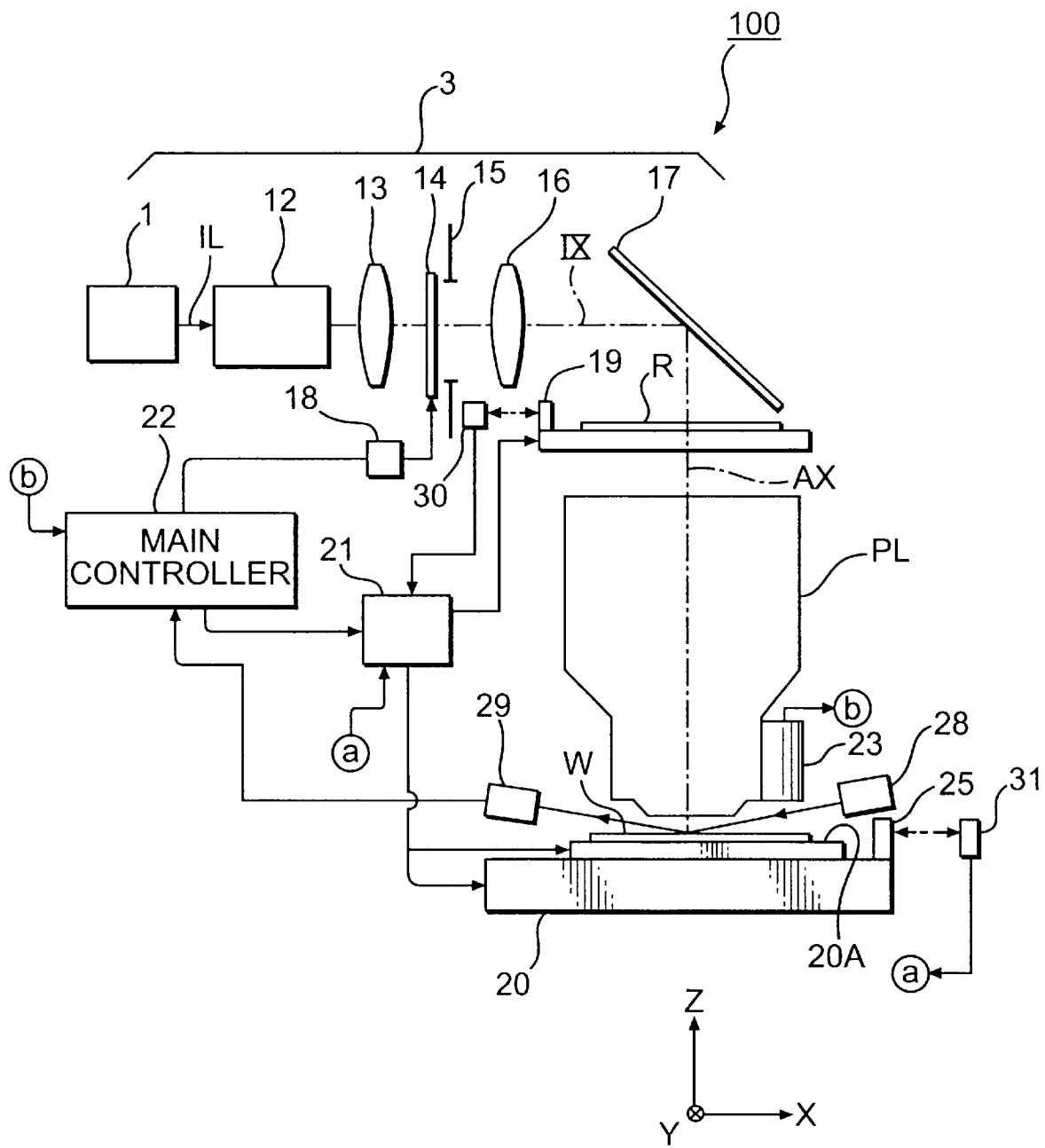
FIG. 2 is an exploded schematic structural diagram illustrating the respective constituent parts of the exposure apparatus, as shown in FIG. 1, except for the base plate, first and second columns.

FIG. 1 illustrates a schematic perspective view of a step-and-scan-type exposure apparatus 100 of the first embodiment of the present invention. FIG. 2 is an exploded schematic structural diagram that illustrates the respective parts of the exposure apparatus 100, except for the base plate, first and second columns, which will be described later.

Figure 3:
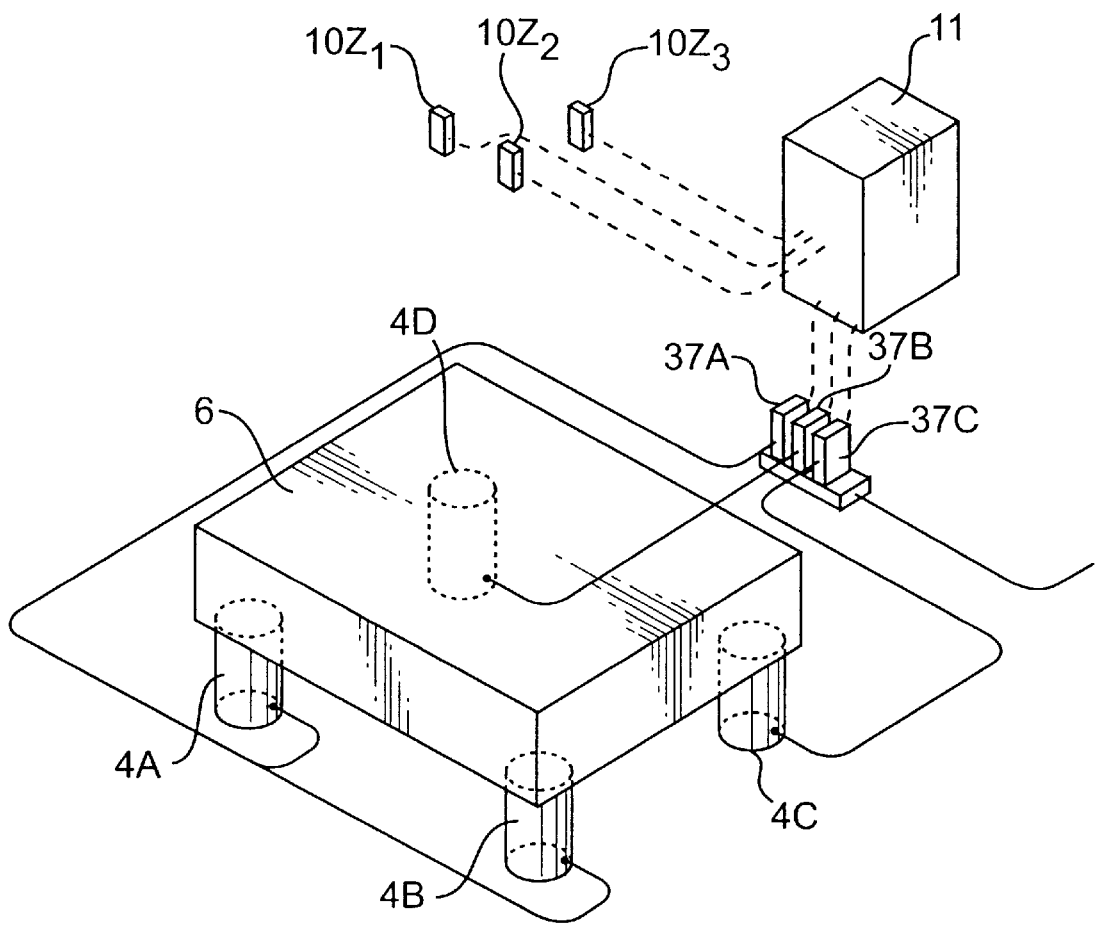
FIG. 3 is a schematic perspective view that illustrates the system used for the driving control of the vibration isolating pads of the present invention.

In FIG. 1, a rectangular plate-shaped pedestal 2 is installed on a floor that constitutes the installation surface for the apparatus. Vibration isolating pads 4A through 4D (the vibration isolating pad 4D is shown in FIG. 3) are installed on the pedestal 2. A rectangular base plate 6 is installed as a vibration isolating stand on the vibration isolating pads 4A through 4D. An optical projection system PL is used in the exposure apparatus 100 of the first embodiment (which will be described later), the Z-axis is taken parallel to the optical-axis of the optical projection system PL, the X-axis is taken in the direction of the length of the base plate 6 in the plane perpendicular to the Z-axis, and the Y-axis is taken in the direction perpendicular to Z-axis. Furthermore, the directions of rotation about the respective axes are defined as the Z$\theta$, Y$\theta$, and X$\theta$-directions. As is necessary in the following description, the directions indicated by the arrows indicating the X-, Y-, and Z-axes in FIG. 1 will be referred to as the +X, +Y, and +Z-directions, while the opposite directions will be distinguished from the directions as the −X, −Y, and −Z-directions.

The vibration isolating pads 4A through 4D are respectively positioned in the vicinities of the four vertices of the rectangular bottom surface of the base plate 6. In the present working configuration, pneumatic dampers are used as the vibration isolating pads 4A through 4D. As shown in FIG. 3, the vibration isolating pads 4A through 4D are connected to a control device 11 via three air pressure control circuits 37A, 37B, and 37C, so that the flow rate of the air supplied to the vibration isolating pads 4A through 4D is controlled by the control device 11 via the air pressure control circuits 37A, 37B, and 37C. Specifically, since the heights of the vibration isolating pads 4A through 4D can be adjusted by means of air pressure, the pneumatic dampers also serve as raising-and-lowering mechanisms.

Figure 5:
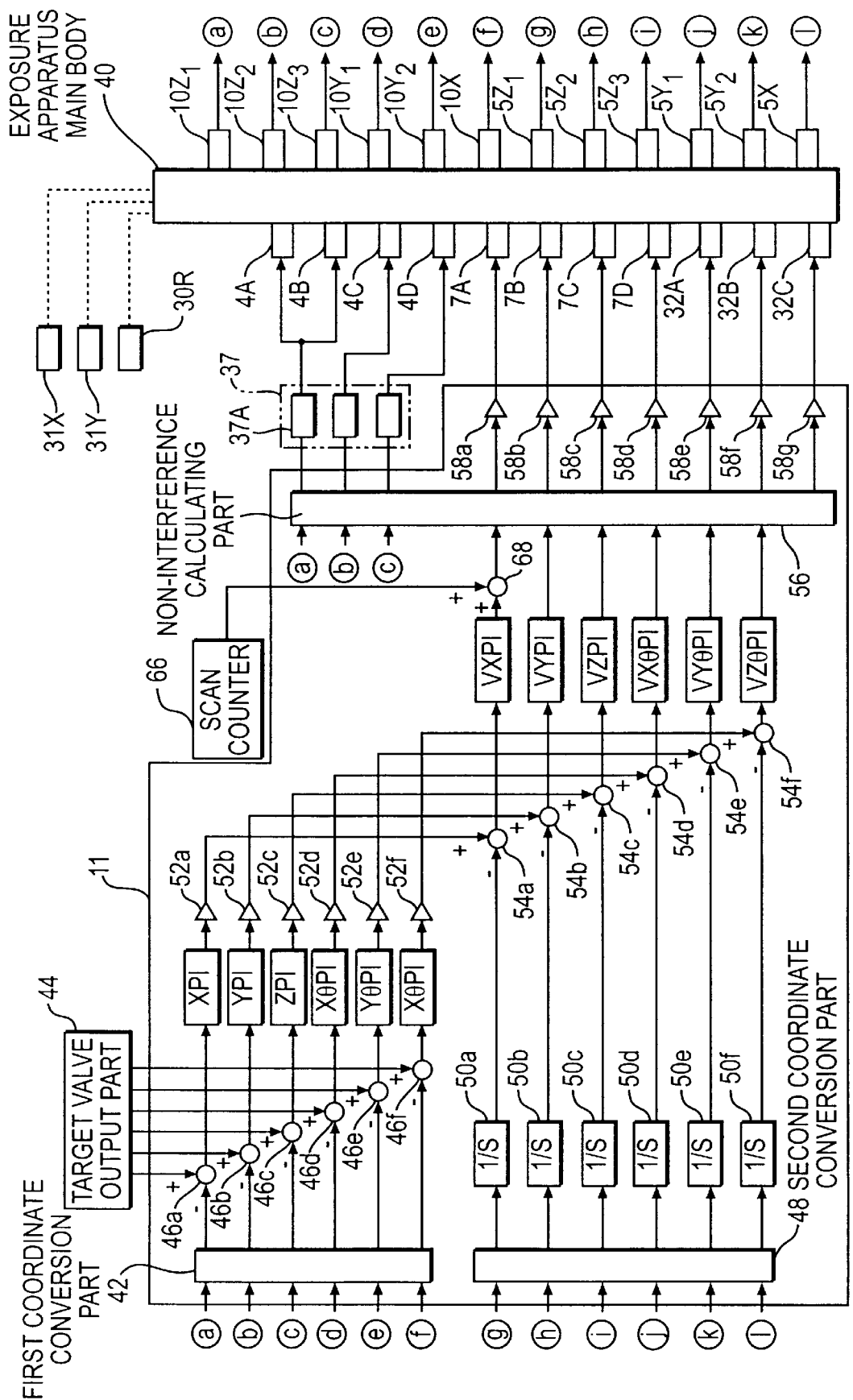
FIG. 5 is a control block diagram illustrating the circuits of the control system used for the actuators and vibration isolating pad of the present invention.

Returning to FIG. 1, actuator 7A is installed parallel to the vibration isolating pad 4A, which is positioned between the pedestal 2 and the base plate 6. The actuator 7A is constructed from a fixed element 9A, which is fastened to the surface of the pedestal 2, and a movable element 8A, which is fastened to the bottom surface of the base plate 6. In response to commands from the control device 11 (shown in FIGS. 3 and 5), the actuator 7A generates a Z-direction driving force against the bottom surface of the base plate 6 from the pedestal 2, or an attractive force oriented toward the pedestal 2 from the bottom surface of the base plate 6. As in the case of the vibration isolating pad 4A, actuators 7B through 7D are also installed parallel to each of the other vibration isolating pads 4B through 4D (the actuators 7C and 7D, which are not visible in FIG. 1 are shown in FIG. 5). The respective driving forces and attractive forces of the actuators 7B through 7D are also set by means of the control device 11 (shown in FIGS. 3 and 5). The method used to control the actuators 7A through 7D will be described later.

As was described above, the actuator 7A consists of a fixed element 9A and a movable element 8A. The fixed element 9A is constructed from a magnetism-generating body in which S-pole shafts are formed on both ends of an N-pole shaft. The movable element 8A is constructed from an inner tube that is fitted loosely over the N-pole shaft, a coil that is wound around the outside of the inner tube, and an outer tube that covers the coil. Moreover, a force is generated in the ±Z-direction between the fixed element 9A and the movable element 8A by adjusting the current that flows through the coil. The other actuators 7B through 7D are constructed in the same manner as the actuator 7A.

An XY-stage 20 is mounted on the base plate 6 as a substrate stage that is driven in the X and Y-directions by a driving means (not shown in the Figures). The XY-stage 20 is constructed from an X-stage, which can be moved in the X-direction (i.e., the scanning direction), and a Y-stage, which can be moved in the Y-direction. In FIG. 1, however, the stages are shown as a single XY-stage 20.

A first column 24 is installed in an upright position on the surface of the base plate 6 so that the first column 24 surrounds the XY-stage 20. An optical projection system PL is fastened to the central portion of the upper plate of the first column 24. A second column 26 is installed in an upright position on the upper plate of the first column 24 so that the second column 26 surrounds the optical projection system PL, and a reticle stage 27 is mounted on the central portion of the upper plate of the second column 26.

The illumination system 3, as shown in FIG. 2, is installed above the reticle stage 27 (not shown in FIG. 1). The illumination system 3 includes a light source 1, an optical illumination-evening optical system 12 including a collimator lens and fly-eye lens (not shown in the Figures), a relay lens 13, a variable ND filter 14, a reticle blind 15, a relay lens 16, and a dichroic mirror 17 (here, an optical illumination system includes the optical illumination-evening system 12, relay lens 13, reticle blind 15, relay lens 16 and dichroic mirror 17).

The elements of the illumination system 3 and its operation will now be described. Illuminating light IL, generated by the light source 1, passes through a shutter (not shown in the Figures) and is then converted into a light beam with a substantially uniform intensity distribution by the optical illumination-evening system 12. An excimer laser light, such as KrF excimer laser light or ArF excimer laser light, is used as the illuminating light IL. The optical illumination system and the excimer laser, which are part of the light source 1, are installed at positions separated from the base plate 6 and first column 24 and second column 26, etc. (i.e., the optical system and light source are installed as a separate installation), so that there is no variation in the irradiation position of the illuminating light IL due to the effects of vibration or inclination of the base plate 6.

The light beam emitted horizontally from the optical illumination-evening system 12 reaches the reticle blind 15 via the relay lens 13. The reticle blind 15 is positioned at a plane, which is optically conjugate with the surface of the reticle R, which is used as a mask and on which the pattern is formed. The exposure surface of the wafer W is used as a photosensitive substrate. The variable ND filter 14 is installed so that the filter adheres tightly to the relay lens 13 side of the reticle blind 15.

Figure 4:
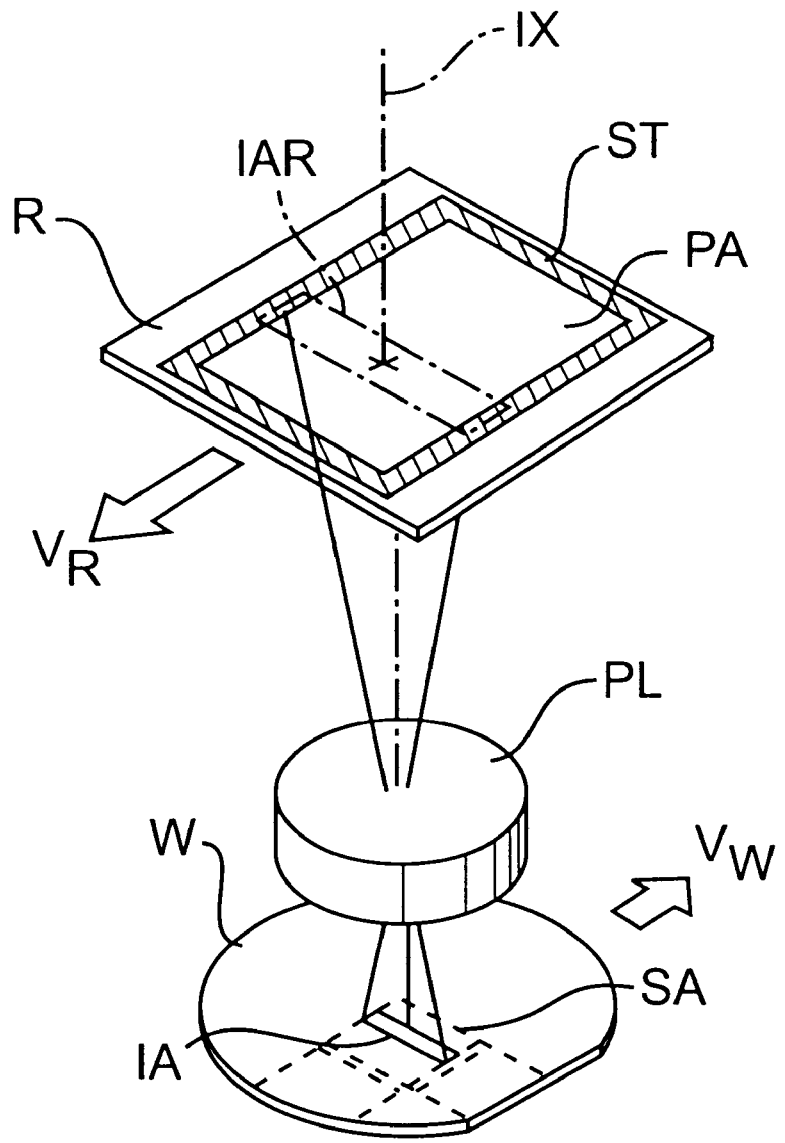
FIG. 4 is a diagram that illustrates the scanning exposure process of the apparatus of FIG. 1 of the present invention.

A reticle blind, in which the size of the aperture part, i.e., slit width, can be adjusted by opening and closing a plurality of variable light-blocking plates (e. g., two L-shaped variable light-blocking plates) by means of a motor, is used as the reticle blind 15. The slit-shaped illumination area IAR as shown in FIG. 4, in which the reticle R is illuminated, can be set at any desired shape and size by adjusting the size of the aperture.

The variable ND filter 14 transmissivity distribution can be set in a desired state. For example, the filter 14 has a double blind structure, a liquid crystal display panel, an electrochromic device or an ND filter having the desired shape. The insertion and removal (as well as the angle of rotation) of the variable ND filter are controlled by means of the variable ND filter control part 18. The intensity distribution in the illumination area IAR on the reticle R can be deliberately made non-uniform, so that the amount of exposure on the wafer W during scanning can be maintained at a constant value. Ordinarily, the variable ND filter 14 as a whole is 100% transmissive and the intensity distribution in the illumination region IAR on the reticle R is uniform.

The light beam, which has passed through the variable ND filter 14 and reticle blind 15 reaches the dichroic mirror 17 via the relay lens 16. The light beam is bent vertically downward so that the illumination area IAR on the reticle R (in which a circuit pattern is drawn) is illuminated.

The reticle R is fastened to the surface of the reticle stage 27 by vacuum suction in this embodiment, although it may be fastened to the reticle step 27 by other means. In order to allow positioning of the reticle R, the reticle stage 27 is constructed so that two-dimensional micro-motion (i.e., motion in the direction of the X-axis, in the direction of the Y-axis, and in the direction of rotation about the Z-axis perpendicular to the XY-plane) is possible in the plane perpendicular to the optical-axis IX of the optical illumination system (the optical-axis IX coincides with the optical-axis AX of the optical projection system PL). The reticle stage 27 can be moved at a designated scanning speed in the a prescribed scanning direction (the X-direction) by means of a reticle driving part (not shown in the Figures) consisting of a linear motor. The reticle stage 27 movement stroke is at least sufficient to allow the entire surface of the reticle R to cut across the optical-axis IX of the optical illumination system.

As is shown in FIG. 2, a moving mirror 19, which reflects the laser beam from a reticle laser interferometer (hereafter referred to as the "reticle interferometer") 30, is fastened to the end portion of the reticle stage 27. The position of the reticle stage 27 in the direction of the X-axis is constantly detected by the reticle interferometer 30 with a resolution of approximately 0.01 microns. Position information (or speed information) for the reticle stage 27 is input into a stage controller 21 and into a main controller 22 via the stage controller 21 from the reticle interferometer 30. On the basis of the position information (or speed information), the stage controller 21 drives the reticle stage 27 via a reticle driving part.

The initial position of the reticle stage 27 is determined by a reticle alignment system (not shown in the Figures) so that the reticle R is positioned with a high degree of precision in a prescribed reference position. Accordingly, the position of the reticle R can be measured with a sufficiently high degree of precision simply by measuring the position of the moving mirror 19 by means of the reticle interferometer 30.

The optical projection system PL is positioned beneath the reticle stage 27 in FIGS. 1 and 2. The direction of the optical-axis AX of the optical system (which coincides with the optical-axis IX of the optical illumination system) is taken as the direction of the Z-axis. A reduction type optical system, which is telecentric on both sides and which has a prescribed projection magnification, e. g., ⅕ or ¼, is used. Accordingly, when illumination area IAR of the reticle R is illuminated by illuminating light IL from the optical illumination system, a reduced image of the circuit pattern on the reticle R is formed on the surface of the wafer W (whose surface is coated with a photoresist, i.e., photosensitive material) via the optical projection system PL by the illuminating light IL passing through the reticle R.

The XY-stage 20 is positioned beneath the optical projection system PL in FIGS. 1 and 2. A wafer W, used as a photosensitive substrate, is attached by vacuum suction to the surface of the XY-stage 20 via a Z-leveling stage, a θ stage (neither of these are shown in the Figures) and a wafer holder 20A. The Z-leveling stage is constructed so that driving of the stage in the direction of the Z-axis and the inclination with respect to the Z-axis can be adjusted and the θ-stage is constructed so that micro-rotation about the Z-axis is possible. The wafer W can be three-dimensionally positioned by means of the XY-stage 20, Z-leveling stage, and θ stage.

The XY-stage 20 is constructed so that the stage can be moved not only in the scanning direction (X-direction), but also in the non-scanning direction (Y-direction) perpendicular to the scanning direction, in order to allow the positioning of a plurality of shot areas on the wafer W in an exposure area that is conjugate with the illumination area IAR. Thus, a step-and-scan operation is performed in which an operation subjects each shot area on the wafer W to a scan exposure and an operation that moves the wafer to the exposure initiation position for the next shot are alternately repeated. The XY-stage 20 is driven in the dimensional X- and Y-directions by a wafer state driving part, such as a motor.

A moving mirror 25 reflects the laser beam from a wafer laser interferometer (hereafter referred to as the "wafer interferometer") is used as a position measuring means and is fastened to the end portion of the XY-stage 20. The position of the XY-stage in the XY-plane is constantly detected by the wafer interferometer 31 with a resolution of approximately 0.01 microns. In actuality, an X-moving mirror, which has a reflective surface that is perpendicular to the scanning directions and a Y-moving mirror, which has a reflective surface that is perpendicular to the non-scanning direction, are installed on the XY-stage 20. A Y-axis laser interferometer 31Y and X-axis laser interferometer 31X are installed facing the mirrors as position measuring means (see FIGS. 1 and 5). In FIG. 2, however, the parts are shown in representative terms as the moving mirror 25 and wafer interferometer 31. Position information or speed information for the XY-stage 20 is input into the stage controller 21 and into the main controller 22 via the stage controller 21. On the basis of the position information or speed information, the stage controller 21 controls the XY-stage 20 via a wafer stage driving part.

In the exposure apparatus 100 as is shown in FIG. 4, the reticle R is illuminated in a rectangular slit-shaped illumination area IAR whose direction of length is oriented perpendicular to the scanning direction (X-direction) of the reticle R. During exposure, the reticle R is scanned in the −X-direction at a speed of $V_R$. The illumination area IAR (whose center substantially coincides with the optical-axis AX) is projected onto the wafer W via the optical projection system PL, so that a slit-shaped projected area IA is formed. Since the wafer W is in an inverted imaging relationship with the reticle R, the wafer W is scanned at a speed of $V_W$ in synchronization with the reticle R in the opposite direction (+X-direction) from the direction of the scanning at a speed of $V_R$, so that the entire area of the shot area SA on the wafer W can be exposed. The scanning speed ratio $V_W/V_R$ is accurately set in accordance with the reducing magnification of the optical projection system PL, so that the pattern area PA on the reticle R is accurately reduced and transferred into the shot area SA on the wafer W. The width of the illumination area IAR in the direction of length is set so that the width is greater than the width of the pattern area PA on the reticle R, but narrower than the maximum width of the light-blocking area ST. Thus, the entire surface of the pattern area PA is illuminated by scanning.

Returning to FIG. 2, an off-axis type alignment microscope 23 (described later) used as a detection means that detects the positions of alignment marks (wafer marks), provided as measurement marks for each shot area on the wafer W, is installed on the side surface of the optical projection system PL. The measurement results obtained by the alignment microscope 23 are sent to the main controller 22, which controls the operation of the apparatus as a whole.

An image processing type microscope is used as the alignment microscope 23. The alignment microscope 23 includes a light source, such as a halogen lamp that emits a broad-band illuminating light, an objective lens, an index plate, an imaging element, such as a CCD, a signal processing circuit and an operating circuit (none of which are shown in the Figures). The illuminating light emitted by the light source of the alignment microscope 23 is directed onto the wafer W after passing through the objective lens inside the alignment microscope 23, and the light reflected from the wafer mark area on the surface of the wafer W returns to the interior of the alignment microscope 23 and successively passes through the objective lens and the index plate so that an image of the wafer marks and an image of the index on the index plate are formed on the imaging surface of the CCD. Photoelectrically converted signals of the images are processed by the signal processing circuit, and the relative positions of the wafer marks and the index are calculated by the operating circuit. The results of the calculations are sent to the main controller 22. Various methods for alignment of the wafer W have been proposed; other methods may be similarly used.

The inclined incidence-type focal point detection system includes (a) an optical irradiation system 28 that supplies an imaging light beam (used to form a pinhole or slit image) that is directed toward the optimal imaging plane of the optical projection system from a direction that is inclined with respect to the direction of the optical-axis AX, and (b) a light-receiving optical system 29 that receives (via a slit) the reflected light beam that is formed when the imaging light beam is reflected by the surface of the wafer W. This detection system is installed in the exposure apparatus 100 of the present embodiment. The focal point detection system 28, 29 is supported via a supporting member (not shown in the Figures) on the first column 24 (shown in FIG. 1) which supports the optical projection system PL. The focal point detection system 28, 29 is disclosed in Japanese Patent Application Kokai No. 60-168112. The positional deviation in the vertical direction (Z-direction) with respect to the imaging plane of the wafer surface is detected and the detection signal is used to drive the Z-leveling stage in the Z-direction so that a prescribed gap is maintained between the wafer W and the optical projection system PL. Detection information from the focal point detection system 28, 29 is sent to the stage controller 21 via the main controller 22. The stage controller 21 drives the Z-leveling stage in the Z-direction on the basis of the detection information.

A horizontal position detection system (not shown in the Figures), such as that disclosed in Japanese Patent Application Kokai No. 58-113706, is employed in the present embodiment The inclination of a prescribed area on the wafer, with respect to the imaging plane, is detected by the horizontal position detection system and the detection information is sent to the stage controller 21 via the main controller 22. The stage controller 21 inclines the Z-leveling stage on the basis of the detection information.

In the main controller 22, the arrangement of the shot areas on the wafer W is calculated by a statistical operation using the method of least squares (as disclosed in Japanese Patent Application Kokai No. 61-44429) on the basis of the measurement results obtained for the wafer mark positions measured by the alignment microscope 23. The shot areas on the wafer W are moved to the exposure initiation position by the stage controller 21, in accordance with the results of the calculations, and the reticle R and wafer W are synchronously scanned. Occurring simultaneously with the synchronous scanning at the reticle R and wafer W, an image of the pattern on the reticle R, which is projected via the optical projection system PL, via the illuminating light IL (used for exposure) from the illumination system 3, is transferred onto each shot area on the wafer W. The shot area on the wafer W is caused to coincide with the imaging plane of the optical projection system PL by driving the Z-leveling stage on the basis of the detection information from the focal point detection system 28, 29 and the horizontal position detection system (not shown in the Figures). By repeating such an operation, the respective shot areas on the wafer are exposed by means of a step-and-scan system.

Returning to FIG. 1, the first column 24 contacts the surface of the base plate 6 by means of four leg parts 24a through 24d (the leg part 24d on the deep side is not viewed in FIG. 1). Acceleration sensors $5Z_1$ and $5Z_2$ (used as vibration sensors), which detect the acceleration of the first column 24 in the Z-direction, and acceleration sensors $5Y_1$ and $5Y_2$, which detect the acceleration of the first column 24 in the Y-direction, are installed on the +Y end portion of the upper surface of the upper plate of the first column 24. An acceleration sensor $5Z_3$ (used as a vibration sensor), which detects the acceleration of the first column 24 in the Z-direction, and an acceleration sensor 5X, which detects the acceleration of the first column 24 in the X-direction, are installed on the +X end portion of the upper surface of the upper plate of the first column 24. For example, piezo-resistance type or electrostatic capacitance type semiconductor acceleration sensors are used as the acceleration sensors $5Z_1$, $5Z_2$, $5Z_3$, $5Y_1$, $5Y_2$, and 5X. The outputs of the acceleration sensors $5Z_1$, $5Z_2$, $5Z_3$, $5Y_1$, $5Y_2$, and 5X are also input into the control device 11.

A displacement sensor 10A formed by integrally combining a displacement sensor $10Z_1$ which detects the displacement of the first column 24 in the Z-direction and a displacement sensor $10Y_1$, which detects the displacement of the first column 24 in the Y-direction, is installed on the +Y end portion of the upper plate of the first column 24 in a position facing the −X side surface and a displacement sensor 10B formed by integrally combining a displacement sensor $10Z_2$, which detects the displacement of the first column 24 in the Z-direction and a displacement sensor $10Y_2$, which detects the displacement of the first column 24 in the Y-direction, is installed on the +Y end portion of the upper plate of the first column 24 in a position facing the +X side surface. Furthermore, a displacement sensor 10C formed by integrally combining a displacement sensor $10Z_3$, which detects the displacement of the first column 24 in the Z-direction and a displacement sensor 10X, which detects the displacement of the first column 24 in the X-direction is installed on the −Y end portion of the upper plate of the first column 24 in a position facing the +X side surface.

The electrostatic capacitance type sensors or overcurrent displacement sensors are used as the displacement sensors $10Z_1$, $10Z_2$, $10Z_3$, $10Y_1$, $10Y_2$, and 10X. In electrostatic capacitance type sensors, the distance between the sensor and the object of measurement (the metal plate not shown in the Figures) is detected utilizing the fact that the electrostatic capacitance between the sensor electrode and the object of measurement is proportional to the distance between the sensor electrode and the object of measurement. In overcurrent displacement sensors, an alternating current is applied beforehand to a coil which is wound around an insulator. When the sensor approaches an object of measurement consisting of a conductive material (conductor) an overcurrent is generated in the conductor by the AC magnetic field created by the coil. The magnetic field generated by the overcurrent is oriented in the opposite direction from the magnetic field created by the coil current, and the two magnetic fields overlap so that there is an effect on the output of the coil, thus causing a variation and the strength and phase of the current flowing through the coil. This variation increases as the object of measurement approaches the coil and conversely decreases as the object of measurement moves away from the coil. Accordingly, the position and displacement of the object of measurement can be ascertained by extracting an electrical signal from the coil. Alternatively, if the particular construction blocks the effects of background light, PSD sensors (semiconductor light position detectors) can be used as displacement sensors.

The outputs of the displacement sensors $10Y_1$, $10Y_2$, $10Z_1$, $10Z_2$, $10Z_3$, and 10X are also sent to the control device 11.

On the +X side surface of the first column 24, an actuator 32A is attached between the first column 24 and a gate-form supporting column 35A which is fastened to the pedestal 2. Like the actuators 7A through 7C, the actuator 32A is constructed from a fixed element 34A that is fastened to the supporting column 35A, and a movable element 33A that is attached to the first column 24 and is arranged so that a force can be applied to the first column 24 in the ±X-direction by adjusting the current that flows through the coil inside the movable element 33A from the control device 11. Similarly, movable elements 33B and 33C are attached to the upper surface of the first column 24 in two places and fixed elements 34B and 34C, which form respective actuators 32B and 32C together with the movable elements 33B and 33C, are fastened respectively to the supporting columns 35A and 35B which are fastened to the pedestal 2. Like the actuator 32A, the actuators 32B and 32C are arranged so that a force can be applied to the first column 24 in the ±Y-direction by adjusting the current flowing through the coils inside the movable elements 33B and 33C from the control device 11. The method used to control the actuators 32A through 32C by means of the control device 11 will be described later.

The adjustment of the height and horizontal level of the base plate 6 at the time of installation of the exposure apparatus 100 will now be described with reference to FIG. 3. Specifically, the displacement of the base plate 6 in the Z-direction (i.e., the height of the base plate 6) measured by the displacement sensors $10Z_1$, $10Z_2$, and $10Z_3$ is transmitted to the control device 11. Based on the displacement data, the control device 11 sets the heights of the vibration isolating pads 4A through 4D at respective height values by controlling the flow rates of air supplied to the respective vibration isolating pads via the three air pressure control circuits 37A through 37C. The height of the base plate 6 is set at a predetermined value so that the horizontal level of the base plate 6 is maintained. The heights of the vibration isolating pads 4A through 4D are then maintained at the respective set values. As a result, no strain is generated in the base plate 6 and the positioning precision of the XY-stage 20 on the base plate 6 can be maintained at a high level.

In the exposure apparatus 100, an exposure apparatus main body part 40 (see FIG. 5) includes the base plate 6, XY-stage 20, wafer holder 20A, first column 24, optical projection system PL, second column 26, and reticle stage 27.

The control system for the actuators 7A through 7D and 32A through 32C and the vibration isolating pads 4A through 4D, which are used to isolate the exposure apparatus main body part 40 from vibration, will now be described with reference to the block diagram shown in FIG. 5, with an emphasis on the control device 11.

The control device 11 has a vibration control system (as a first control system) that performs driving control of actuators 7A, 7B, 7C, 7D, 32A, 32B, and 32C on the basis of the outputs of the displacement sensors $10Z_1$, $10Z_2$, $10Z_3$, $10Y_1$, $10Y_2$, and 10X and the acceleration sensors $5Z_1$, $5Z_2$, $5Z_3$, $5Y_1$, $5Y_2$, and 5X so that vibration of the exposure apparatus main body 40, including the base plate 6, is suppressed.

Specifically, the vibration control system includes the following: a first coordinate conversion part 42, which inputs the respective outputs of the displacement sensors $10Z_1$, $10Z_2$, $10Z_3$, $10Y_1$, and $10Y_2$, and 10X via respective A/D converters (not shown), and converts the outputs into displacement amounts (x, y, z, $\theta_x$, $\theta_y$, $\theta_z$) of the center of gravity G of the exposure apparatus main body part 40 in the X, Y, Z, X$\theta$, Y$\theta$, Z$\theta$; six degrees of freedom; (FIG. 1); six subtractors 46a through 46f, which calculate the positional deviations for respective directions with six degrees of freedom ($\Delta x = x_o - x$, $\Delta y = y_o - y$, $\Delta z = z_o - z$, $\Delta \theta_x = \theta_{xo} \theta_x$, $\Delta \theta_y = \theta_{yo} \theta_y$, $\Delta \theta_z = \theta_{zo} - \theta_z$) i.e., by respectively subtracting the amounts of displacement (x, y, z, $\theta_x$, $\theta_y$, $\theta_z$) of the center of gravity G in the six degrees of freedom (following conversion by the first coordinate conversion part 42) from target values ($x_o$, $y_o$, $z_o$, $\theta_{xo}$, $\theta_{yo}$, $\theta_{zo}$) for the position of the center of gravity in the six degrees of freedom, which are input from a target value output part 44. Position controllers XPI, YPI, ZPI, X$\theta$PI, Y$\theta$PI, and Z$\theta$PI are employed for the respective six degrees of freedom (consisting of PI controllers that perform a control operation using the positional deviations $\Delta x$, $\Delta y$, $\Delta z$, $\Delta \theta_x$, $\Delta \theta_y$ and $\Delta \theta_z$ for respective directions with the six degrees of freedom as operating signals); a second coordinate conversion part 48, which inputs the respective outputs of the acceleration sensors $5Z_1$, $5Z_2$, $5Z_3$, $5Y_1$, $5Y_2$, and 5X via respective A/D converters, and which converts the outputs into accelerations (x'', y'', z'', $\theta_x''$, $\theta_y''$, $\theta_z''$) of the center of gravity G in the six degrees of freedom; integrators 50a through 50f that integrate the accelerations x'', y'', z'', $\theta_x''$, $\theta_y''$ and $\theta_z''$ of the center of gravity G in the six degrees of freedom (following conversion by the second coordinate conversion part 48) and thus convert the accelerations into speeds x', y', z', $\theta_x'$, $\theta_y'$, and $\theta_z'$ of the center of gravity G in the respective directions; speed conversion gains 52a through 52f that convert the outputs of the position controllers XPI, YPI, ZPI, X$\theta$PI, Y$\theta$PI, and Z$\theta$PI into respective speed command values $x_o'$, $y_o'$, $z_o'$, $\theta_{xo}'$, $\theta_{yo}'$ and $\theta_{zo}'$; six subtractors 54a through 54f that calculate speed deviations for the respective six degrees of freedom ($\Delta x' = x_0' - x'$, $\Delta y' = y_0' - y'$, $\Delta z' = z_0' - z'$, $\Delta \theta_x' = \theta_{zo}' - \theta_x'$, $\Delta \theta_y' = \theta_{yo}' - \theta_y'$, $\Delta \theta_z' = \theta_{zo}' - \theta_z'$) by respectively subtracting the outputs x', y', z', $\theta_x'$, $\theta_y'$ and $\theta_z'$ of the integrators 50a through 50f from the speed command values $x_o'$, $y_o'$, $z_o'$, $\theta_{xo}'$, $\theta_{yo}'$ and $\theta_{zo}'$ following the conversion; speed controllers VXPI, VYPI, VZPI, VX$\theta$PI, VY$\theta$PI, and VZ$\theta$PI are employed for the respective six degrees of freedom (consisting of PI controllers which perform a control operation using the speed deviations $\Delta x'$, $\Delta y'$, $\Delta z'$, $\Delta \theta_x'$, $\Delta \theta_y'$, and $\Delta \theta_z'$ for the respective six degrees of freedom as operating signals); a non-interference calculating part 56 that performs non-interference calculations for the purpose of converting the speed control amounts in the six degrees of freedom calculated by the controllers into speed command values that are to be generated at the positions of the respective actuators and driving force gains 58a through 58g that convert the speed command values that are to be generated at the positions of the respective actuators into driving forces that are to be generated by the respective actuators (following the conversions by the non-interference calculating part 56).

Specifically, the vibration control system of the configuration is a multiple-loop control system that has a speed control loop including acceleration sensors, integrators and speed controllers, as an internal loop inside a position control loop that includes displacement sensors and position controllers.

Additionally, in the apparatus 100, the target value output part 44 includes a microcomputer wherein the target setting values and target setting ranges are not uniformly set, but are instead set separately for each operating mode, such as exposure, alignment, and loading, which will be described in detail later.

The non-interference calculating part 56 calculates the inclination of the base plate 6 (generated by the movement of the XY-stage 20 and reticle stage 27) on the basis of the outputs of the displacement sensors $10Z_1$, $10Z_2$, and $10Z_3$, and is also equipped with a means to correct the inclination. Specifically, the non-interference calculating part 56 calculates (detects) the inclination of the base plate 6 by directly monitoring the outputs of the displacement sensors $10Z_1$, $10Z_2$, and $10Z_3$ at all times and controls the first through third air pressure control circuits 37A through 37C, which make up the air pressure control part 37, so that the inclination of the base plate 6 is corrected by the vibration isolating pads 4A through 4D. The non-interference calculating part is capable of preventing the speed command values that are to be generated in the actuators 7A through 7D (obtained as a result of the non-interference calculations) from exceeding prescribed values.

The output of a scan counter 66 is fed forward into the vibration control system via adder 68, which is installed in the output stage of the X-direction speed controller VXPI. In the exposure apparatus 100 when a shot is exposed on the wafer W, the reticle stage 27 and XY-stage 20 are synchronously scanned in opposite directions along the scanning direction, i.e., along the X-axis. The reticle stage 27 moves once per shot from one end of the movement range of the reticle stage 27 to the other at a speed which is greater than the speed of the XY-stage by a section equal to the reciprocal of the reduction magnification of the optical projection system PL (i.e., 4 times or 5 times), wherein the exposure is performed only in the constant-speed region. Accordingly, the reticle stage 27 undergoes respective transitions between three states as follows: (1) acceleration from a stopped state to the target speed; (2) maintenance of the target speed; and (3) deceleration from the target speed to a stopped state. In (1) (immediately following the initiation of movement of the stage 27) and (3) (immediately prior to the stopping of the stage 27), a large reaction force acts on the base plate 6 via the second column 26, so that vibration is generated in the exposure apparatus main body part 40 (including the base plate 6). Accordingly, a command value for a reaction force oriented in the opposite direction from the direction of acceleration of the reticle stage 27 is fed forward into the vibration control system by the scan counter 66, so that vibration occurring immediately following the initiation of movement of the stage 27 and vibration occurring immediately prior to the stopping of the stage 27 are suppressed.

The air pressure control part 37, which is used to control the heights of the vibration isolating pads 4A through 4D, will be now described with reference to FIG. 6.

This air pressure control part 37 has first through third air pressure control circuits 37A through 37C, which are respectively connected to an air supply circuit 110 via a manual valve 101. The air pressure control circuits are also respectively connected to an exhaust circuit 120. The manual valve 101 is used to switch the air supply pressure ON or OFF manually.

The first air pressure control circuit 37A is used to control the flow rate of air that is supplied to the vibration isolating pad 4D located as shown in FIG. 3. This air pressure control circuit 37A includes a first circuit 38a and a second circuit 38b that are parallel to each other. The first circuit 38a includes a regulator 102A that sets the supply side pressure, a pressure sensor 104A that detects the air pressure inside the air passage set by the regulator 102A, two throttles that are installed in the air passage in which the pressure sensor 104A is installed, i.e., a fixed throttle 106A on the micro-motion side, and a speed controller 105A on the rough movement side, a three-port electromagnetic valve 107A, that switches between the fixed throttle 106A and the speed controller 105A (selectively switching the throttles on), and a two-port electromagnetic valve 108A that is installed on the opposite side of the electromagnetic valve 107A from the fixed throttle 106A that switches the air passage on or off.

Similarly, the second circuit 38b includes a regulator 102a that sets the exhaust side pressure, a pressure sensor 104a that detects the air pressure inside the air passage set by the regulator 102a, two throttles that are installed in the air passage in which the pressure sensor 104a is installed, i.e., a fixed throttle 106a on the micro-motion side, and a speed controller 105a on the rough movement side, a three-port electromagnetic valve 107a that switches between the fixed throttle 106a and the speed controller 105a, and a two-port electromagnetic valve 108a that is installed on the opposite side of the electromagnetic valve 107a from the fixed throttle 106a and that switches the air passage on or off. A pressure sensor 103A that detects the supply pressure of the first air pressure control circuit 37A is installed at the confluence point of the first circuit 38a and second circuit 38b.

The fixed throttles 106A and 106a are made of a hard material, such as stainless steel or ruby and have a fine hole formed by a laser. The hole diameter is approximately 50 microns to 300 microns. It is also possible to use variable throttles, such as precision needle valves, in the first through third air pressure control circuits.

The flow rate of the air that is supplied to and discharged from the vibration isolating pad 4D is determined by the effective cross-sectional areas of the respective throttles, the pressure ratio between the first circuit (supply side circuit) 38a and the first air pressure control circuit 37A, and the pressure ratio between the second circuit (exhaust side circuit) 38b and the first air pressure control circuit 37A. Accordingly, the flow rate can be arbitrarily set by setting the pressure by means of the regulators 102A and 102a and switching the fixed throttles 106A and 106a on the micro-motion side and the speed controllers 105A and 105a on the rough movement side.

Similar to the first pressure control circuit 37A, the second pressure control circuit 37B includes a third circuit 39a and a fourth circuit 39b that are parallel to each other. The third circuit 39a includes a regulator 102B, pressure sensor 104B, micro-motion side fixed throttle 106B, rough motion side speed controller 105B, three-port electromagnetic valve 107B and two-port electromagnetic valve 108B. The fourth circuit 39b includes a regulator 102b, pressure sensor 104b, micro-motion side fixed throttle 106b, rough motion side speed controller 105b, three-port electromagnetic value 107b and two-port electromagnetic valve 108b. A pressure sensor 103B, which detects the supply pressure of the second air pressure control circuit 37B, is installed at the confluence point of the third circuit 39a and fourth circuit 39b.

Similar to the first pressure control circuit 37A, the third pressure control circuit 37C includes a fifth circuit 40a and a sixth circuit 40b that are parallel to each other. The fifth circuit 40a includes a regulator 102C, pressure sensor 104C, micro-motion side fixed throttle 106C, rough motion side speed controller 105C, three-port electromagnetic valve 107C and two-port electromagnetic valve 108C. The sixth circuit 40b includes a regulator 102c, pressure sensor 104c, micro-motion side fixed throttle 106c, rough motion side speed controller 105c, three-port electromagnetic valuve 107c and two-port electromagnetic valve 108c. A pressure sensor 103C, which detects the supply pressure of the third air pressure control circuit 37C, is installed at the confluence point of the fifth circuit 40a and sixth circuit 40b.

In the second and third air pressure control circuits 37B and 37C, as in the first air pressure control circuit 37A, the flow rate can be arbitrarily set by setting the pressure by means of the regulators and switching the fixed throttles and speed controllers.

Figure 6:
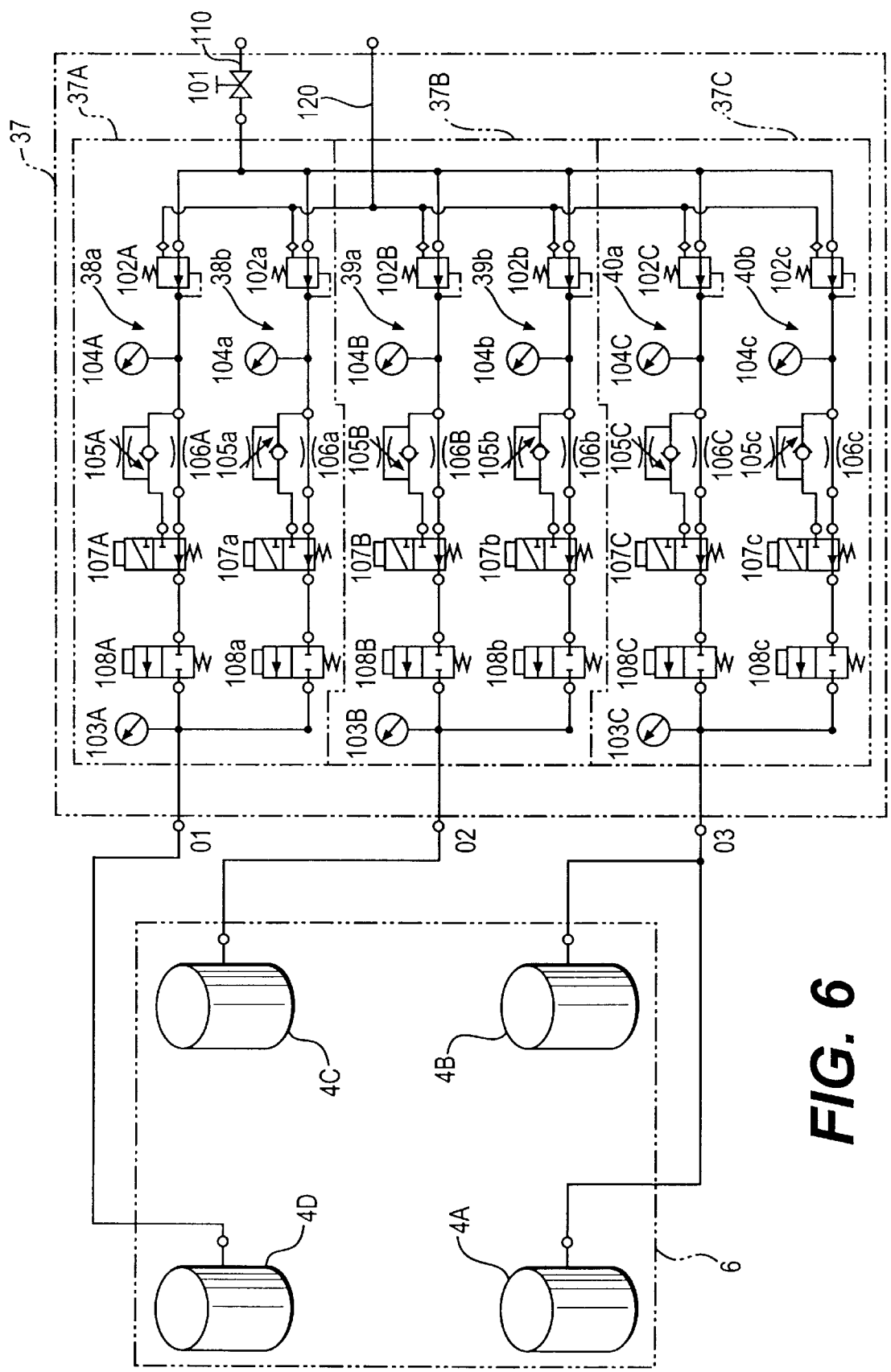
FIG. 6 illustrates an example of the circuitry of the air pressure control circuits used to control the respective flow rates of the air supplied to the vibration isolating pads of the present invention.
Figure 7A:
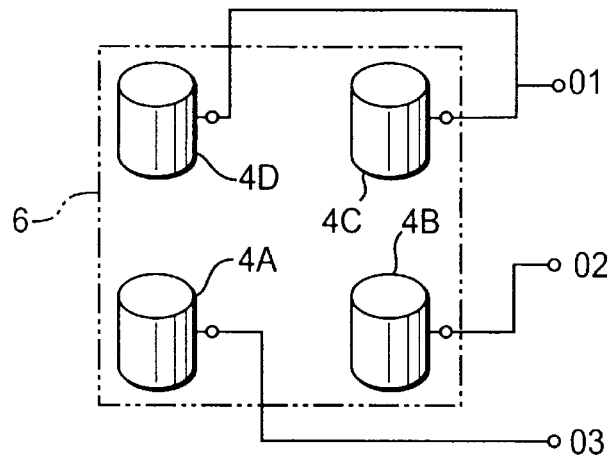
FIGS. 7(A), 7(B), and 7(C) illustrate alternate methods for the connection of the air pressure control circuits to the vibration isolating pads of the present invention.
Figure 7B:
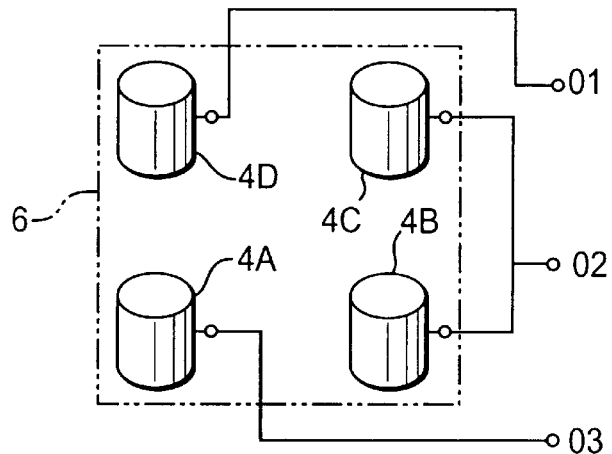
Figure 7C:
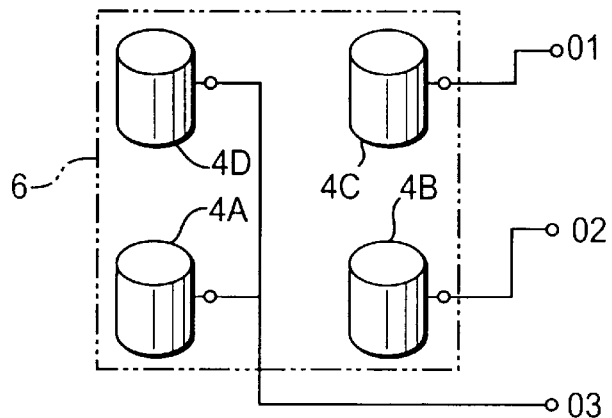

As shown in FIG. 6, two of the four vibration isolating pads, i.e., the two vibration isolating pads 4A and 4B, are controlled by the same air pressure system. However, in the air pressure control part 37, the paths that supply air to the vibration isolating pads 4A through 4D consist of three systems. The method used to connect the respective air pressure control circuits to the vibration isolating pads 4A through 4 D (i.e., the combination of systems and vibration isolating pads) may be arranged in various configurations, as shown in FIGS. 7(A), 7(B), and 7(C). The various configurations are utilized so that the controllability of the inclination of the exposure apparatus main body part 40 can be optimized by selecting one of the configurations. The configuration is selected in accordance with the position of the center of gravity of the exposure apparatus main body part 40 and the positions of the vibration isolating pads 4A through 4D.

The respective internal pressures of the vibration isolating pads 4A through 4D supporting the exposure apparatus main body part 40 are determined by the weight and position of the center of gravity of the exposure apparatus main body part 40 and by the positions of the vibration isolating pads 4A through 4D. Moreover, when the exposure apparatus main body part 40 is at the set height and level, the pressures required in the vibration isolating pads 4A through 4D can be monitored by the pressure sensors, 103A, 103B, and 103C.

The method used to adjust the flow rates of the air supplied to the vibration isolating pads will now be described.

As a prerequisite, the fixed throttles 106A, 106B, 106C, and 106a, 106b, 106c are selected in accordance with the respective pressures required in the vibration isolating pads 4A through 4D, which are determined by the weight and position of the center of gravity of the exposure apparatus main body part 40, and the positions of the vibration isolating pads 4A through 4D.

The regulators 102A, 102B, 102C, and 102a, 102b, 102c are adjusted in accordance with the target supply pressures for the respective vibration isolating pads. At the time of the adjustment, flow rate measurements may be performed. A position control loop, which corrects all or part of the inclination of the base plate 6, includes the displacement sensors $10Z_1$, $10Z_2$, $10Z_3$, the non-interference calculating part 56 inside the control device 11, the air pressure control part 37 and the vibration isolating pads 4A through 4D. The rate of change in the heights of the vibration isolating pads 4A through 4D is determined on the basis of the outputs of the displacement sensors $10Z_1$, $10Z_2$, and $10Z_3$. The values monitored by the pressure sensors 104A, 104B, 104C and 104a, 104b, 104c may be used as a standard in the adjustment of the regulators 102A, 102B, 102C and 102a, 102b, 102c.

The speed controllers 105A, 105B, 105C and 105a, 105b, 105c are adjusted so that the flow rate on the rough movement side is determined.

In the air pressure control part 37, the gain of the position control loop for the base plate 6 constituting the vibration isolating stand can be set in two arbitrary states, i.e., high or low, by switching the flow rate control of the air supplied to the vibration isolating pads 4A through 4D between the rough movement and micro-motion systems.

The method used to set the control mode in accordance with the apparatus operating mode (relating to the movement of the XY-stage) in the target value output part 44 used as a setting means in the present embodiment will now be described. The apparatus operating mode refers to various operating modes such as exposure, alignment, and loading, which will be described later. The modes are some of the operating modes of the moving body in the present invention. The target value output part 44 sets the control mode of the exposure apparatus main body part 40 (including the base plate 6) by altering either the target setting values or the target setting ranges, or both, for each operating mode. Setting the target setting values and/or target setting ranges separately for each operating mode are done for several reasons.

Using the inclination of the exposure apparatus main body part 40 as an example, the following situation arises—the excimer laser, used as the light source 1, is installed separately from the exposure apparatus main body part 40 so that the light source 1 is not inclined even if the exposure apparatus main body part is tilted. A deviation in the irradiation position of the exposure light is created by the tilting of the exposure apparatus main body part 40 if this relationship is left uncorrected. Accordingly, during the exposure operation it is necessary to maintain the exposure apparatus main body part 40 (including the base plate 6) in the prescribed basic attitude (ordinarily horizontal) so that the irradiation position of the exposure light always remains fixed. On the other hand, during an alignment operation, in which the alignment marks are measured, there is no danger that any error will be generated in the measurement of the alignment mark positions by the alignment microscope 23 due to the tilting of the exposure apparatus main body part 40 alone. The light source used for the alignment microscope 23 is ordinarily installed as an integral part of the exposure apparatus main body part 40 so that if the exposure apparatus main body part 40 tilts, the light source of the alignment microscope 23 is also inclined by the same amount. In such cases, it is not absolutely necessary to return the exposure apparatus main body part 40 to the basic attitude. Furthermore, in the reticle R or wafer W loading operation, it is sufficient if the exposure apparatus main body part 40 is maintained in a fixed attitude during the receiving operation of the reticle R or wafer W. Accordingly, by setting the target setting values for each operation, it is possible to prevent unnecessary height adjustments of the vibration isolating pads 4A through 4D and driving of the actuators 7A through 7D and 32A through 32C.

The target setting ranges (permissible error ranges) are different in each of the operations. Accordingly, if the ranges are set separately for each operation instead of being uniformly fixed, unnecessary driving of the actuators can be avoided.

The setting of the control mode for each operating mode by the target value output part 44, i.e., the method used to set the target setting values and target setting ranges, will now be described in detail.

(1) Exposure Operating Mode (First Mode)

The target setting values are determined by a coordinate conversion of the setting ranges in accordance with values of the positional deviations and angular deviations permitted at the emission position of the light source 1 ($X \pm \Delta X$, $Y \pm \Delta Y$, $Z \pm \Delta Z$, $X\theta \pm \Delta X\theta$, $Y\theta \pm \Delta Y\theta$, $Z\theta \pm \Delta Z\theta$). For example, where the light source 1 is installed separately from the exposure apparatus main body 40, $X=Y=Z=X\theta=Y\theta=Z\theta=0$, and a correction is constantly applied for the inclination of the exposure apparatus main body part 40. The target setting ranges are determined on the basis of the tolerance values required in order to ensure the correct amount of exposure. Furthermore, the target value output part 44 outputs target values with six degrees of freedom which have target setting ranges centered on the target setting values.

(2) Alignment Operating Mode (Second Mode)

Where the light source used for alignment is installed as an integral part of the exposure apparatus main body 40, there is no need to perform any correction for the amount of inclination, and it is necessary only to suppress vibration. Accordingly, in the target value output part 44, the values of X, Y, Z, X$\theta$, Y$\theta$, and Z$\theta$ are set at the predicted values for the stopped position of the XY-stage 20 when the alignment operation is performed and the target setting ranges are determined on the basis of the vibration amplitude required in order to maintain the alignment precision.

The method used to calculate the amount of inclination of the base plate 6 (which is a prerequisite for the determination of the predicted values), i.e., the method used to calculate the amounts of sinking $\delta_1$, $\delta_2$, $\delta_3$, and $\delta_4$ of the vibration isolating pads 4A, 4B, 4C, and 4D, will now be described.

Figure 8:
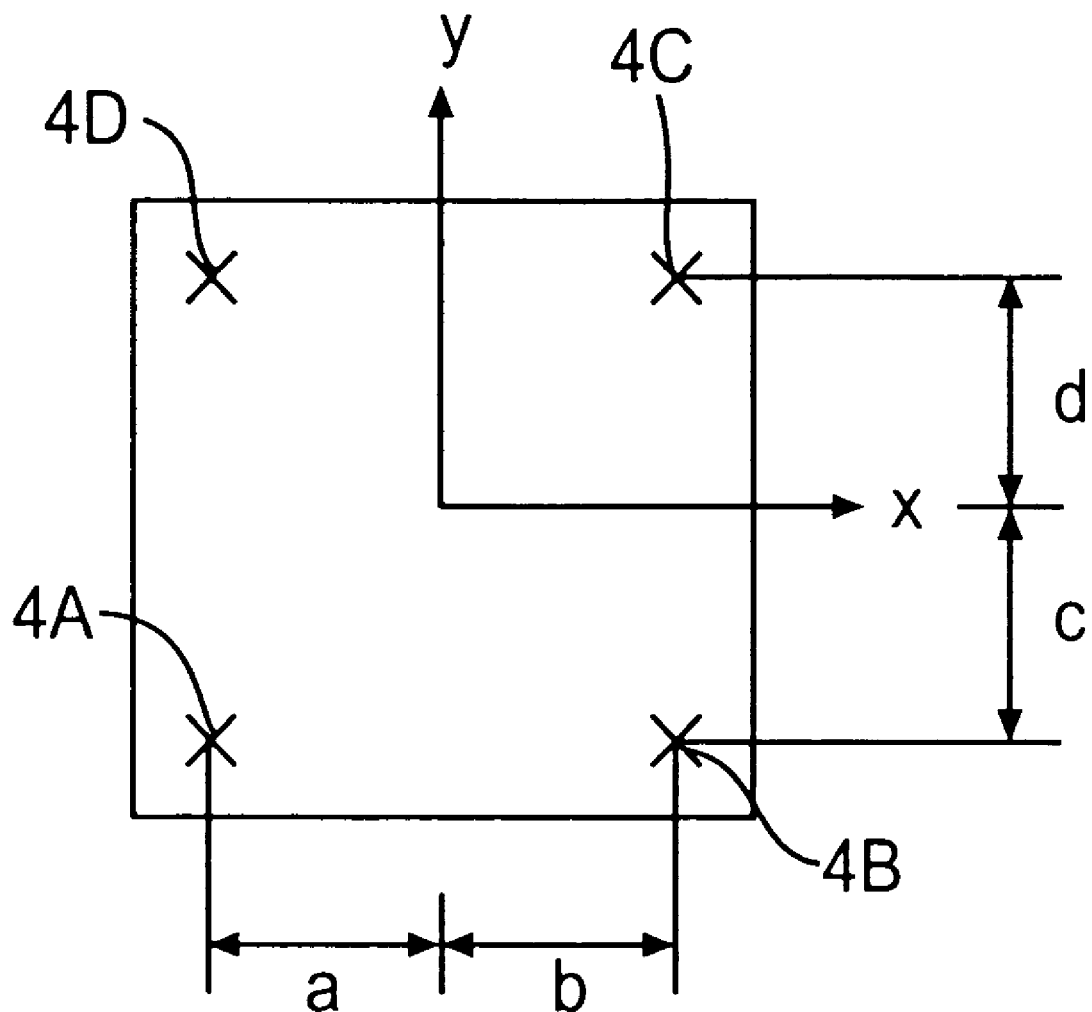
FIG. 8 illustrates one example of the arrangement of the vibration isolating pads.

An example will be described in which the vibration isolating pads 4A through 4D are installed in the positional relationship as shown in FIG. 8, the reticle stage (mass M1) is moved to the position (r, 0) in the wafer stage coordinate system, the Y stage (mass M2) is moved to the position (q, p), and the X-stage (mass M3) is moved to the position (q, 0).

The respective forces acting on the vibration isolating pads 4A, 4B, 4C, and 4D, as a result of the movement of the position of the center of gravity of the exposure apparatus main body part 40 due to the movement of the respective stages, are designated as $f_1$, $f_2$, $f_3$, and $f_4$, can be expressed by Equation (1) as follows:

$$f_1 = -\frac{M_2 P}{2(c+d)}g - \frac{M_1 r + (M_2 + M_3)q}{2(a+b)}g \qquad (1)$$

$$f_2 = -\frac{M_2 P}{2(c+d)}g + \frac{M_1 r + (M_2 + M_3)q}{2(a+b)}g$$

$$f_3 = \frac{M_2 P}{2(c+d)}g + \frac{M_1 r + (M_2 + M_3)q}{2(a+b)}g$$

$$f_4 = \frac{M_2 P}{2(c+d)}g - \frac{M_1 r + (M_2 + M_3)q}{2(a+b)}g$$

Thus, the forces $f_1$, $f_2$, $f_3$, and $f_4$ acting on the vibration isolating pads 4A through 4D as a result of the movement of the position of the center of gravity are determined on the basis of the movement command values for the respective stages and the weights of the respective stages.

Furthermore, since the spring constants of the vibration isolating pads vary according to the pressure values inside the vibration isolating pads, the spring constants can be calculated from the values measured by the pressure sensors 103A, 103B, and 103C. Accordingly, if the spring constants (functions of the internal pressure P) of the vibration isolating pads 4A, 4B, 4C, and 4D are respectively designated as $K_1$, $K_2$, $K_3$, and $K_4$, the amounts of sinking $\delta_1$, $\delta_2$, $\delta_3$, and $\delta_4$ of the vibration isolating pads 4A, 4B, 4C, and 4D can be expressed by Equation (2) as follows:

$$\delta_1 = \frac{f_1}{K_1(P)} \qquad (2)$$

$$\delta_2 = \frac{f_2}{K_2(P)}$$

$$\delta_3 = \frac{f_3}{K_3(P)}$$

$$\delta_4 = \frac{f_4}{K_4(P)}$$

Accordingly, during the alignment operating mode, the target value output unit 44 predicts the inclination of the base plate 6 by calculating the amounts of sinking $\delta_1$, $\delta_2$, $\delta_3$, and $\delta_4$ (using Equation (1) and Equation (2)) on the basis of the movement command values for the respective stages (provided by a main computer not shown in the Figures) and the values measured by the pressure sensors 103A, 103B, and 103C, and also determines the target setting values X, Y, Z, X$\theta$, Y$\theta$, and Z$\theta$ so that the final inclination agrees with the predicted value. Furthermore, the target value output part 44 outputs target values with six degrees of freedom which have target setting ranges centered on the target setting values.

(3) Loading Operating Mode (Third Mode)

It is necessary to maintain a fixed attitude only while the XY-stage 20 (or reticle stage 27) moves to a prescribed wafer (or reticle) receiving position and receives a wafer (or reticle). Accordingly, in the target value output part 44, the values of X, Y, Z, X$\theta$, Y$\theta$, and Z$\theta$ are set as fixed values that are determined from the stopped position of the XY-stage 20 (or reticle stage 27) during the wafer (or reticle) receiving operation. The target setting ranges are set on the basis of the tolerance values required in order to insure an appropriate receiving precision. Furthermore, the target value output part 44 outputs target values with six degrees of freedom that have target setting ranges centered on the target setting values.

The effect of the invention in the case of scanning exposure (first mode) of the exposure apparatus 100 constructed as described above will now be described.

When an exposure operating mode start command is issued by the main computer, scanning exposure is initiated by the main controller 22 and stage controller 21. The target value output part 44 outputs target values with six degrees of freedom that have target setting ranges centered on the target setting values in the exposure operating mode.

The XY-stage 20 and reticle stage 27 are scanned along the X-axis during the scanning exposure, the center of gravity of the exposure apparatus main body 40 moves, and the exposure apparatus main body 40 (including the base plate 6) is tilted. The outputs of the displacement sensors $10Z_1$, $10Z_2$, and $10Z_3$ are sent to the non-interference calculating part 56 of the control device 11. The outputs of the displacement sensors $10Z_1$, $10Z_2$, $10Z_3$, $10Y_1$, $10Y_2$, and 10X and the acceleration sensors $5Z_1$, $5Z_2$, $5Z_3$, $5Y_1$, $5Y_2$, and 5X are also sent to the vibration control system of the control device 11.

The non-interference calculating part 56 calculates the inclination of the base plate 6 on the basis of the outputs of the displacement sensors $10Z_1$, $10Z_2$, and $10Z_3$, and controls the flow rates of the air supplied to the vibration isolating pads 4A through 4D so that the inclination is corrected. The gain switching is performed in the non-interference calculating part 56, so that the response of the height control of the vibration isolating pads 4A through 4D is increased, and so that the size of the non-sensitive zone is reduced, thus ensuring sufficient convergence.

As a result, most, if not all, of the inclination of the exposure apparatus main body 40 can be corrected quickly by the vibration isolating pads 4A through 4D. Furthermore, vibration caused by the movement of center of gravity of the exposure apparatus main body 40 due to movement of the stages 20 and 27 is effectively suppressed as a result of the actuators 7A, 7B, 7C, 32A, 32B, and 32C being driven and controlled by the control device 11 on the basis of the outputs of the displacement sensors $10Z_1$, $10Z_2$, $10Z_3$, $10Y_1$, $10Y_2$, and 10X and acceleration sensors $5Z_1$, $5Z_2$, $5Z_3$, $5Y_1$, $5Y_2$, and 5X. The remaining inclination of the exposure apparatus main body 40 is corrected by the actuators 7A, 7B, 7C, and 7D.

Accordingly, the vibration of the exposure apparatus main body 40 can be effectively suppressed without being affected to any appreciable extent by movement of the center of gravity of the exposure apparatus main body 40 due to movement of the stages 20 and 27. Additionally, most of the inclination of the base plate 6 is corrected by controlling the flow rates of the air supplied to the vibration isolating pads 4A through 4D. Thus the driving force required in the actuators 7A, 7B, 7C, and 7D is reduced as compared to the force required where both the vibration and inclination of the exposure apparatus main body 40 are corrected by means of the actuators 7A, 7B, 7C, and 7D alone. As a result, the current flowing through the coils of the movable elements of the actuators 7A, 7B, 7C, and 7D can be kept to the minimum required current, so that the amount of heat generated is conspicuously reduced. Accordingly, temperature variations in the environment of the exposure apparatus 100 can be suppressed.

The alignment operating mode of the present invention will now be described.

The target value output part 44 receives an alignment operating mode command and stage position commands from the main computer, and outputs target values with six degrees of freedom. The target values have target setting ranges centered on the target setting values for the alignment operating mode, as was described above. The vibration caused by the movement of center of gravity of the exposure apparatus main body 40, due to movement of the XY-stage 20, is effectively suppressed as a result of the actuators 7A, 7B, 7C, 32A, 32B, and 32C being driven and controlled by the control device 11 on the basis of the outputs of the displacement sensors $10Z_1$, $10Z_2$, $10Z_3$, $10Y_1$, $10Y_2$, and 10X and acceleration sensors $5Z_1$, $5Z_2$, $5Z_3$, $5Y_1$, $5Y_2$, and 5X. The target values, determined on the basis of the values predicting the inclination of the base plate 6 caused by the movement of the XY-stage 20 to the designated coordinate position, are outputted. Accordingly, there is almost no need to drive the vibration isolating pads 4A through 4D or actuators 7A through 7D in order to correct the inclination. As a result, the amount of heat generated by the actuators 7A through 7D can be further reduced.

In the loading operating mode, target values with six degrees of freedom, which have target setting ranges centered on the target setting values for the loading mode are output, and the actuators 7A through 7D and 32A through 32C and air pressure control circuits 37A through 37C are controlled by the vibration control system and non-interference calculating part 56 of the control device 11. Thereby, the exposure apparatus main body part is maintained in a fixed attitude during the wafer (or reticle) loading operation.

A second control system is formed by the non-interference calculating part 56 and air pressure control part 37 (air pressure control circuits 37A through 37C) in the present embodiment.

The control mode of the exposure apparatus main body part 40 (including the base plate 6) is set in accordance with the apparatus operating mode by the target value output part 44. A plurality of actuators are controlled by the control device (vibration control system) 11 on the basis of the outputs of displacement sensors and vibration sensors in accordance with the set control mode, thus effecting vibration control and position control of the exposure apparatus main body 40. As compared to the conventional methods, wherein the target setting values and target setting ranges of vibration control and position control are uniformly determined, the present invention allows a more efficient actuator control operation corresponding to the apparatus operating mode.

For example, the positioning setting time of the XY-stage can also be set at an appropriate value in accordance with the operating mode. Moreover, in cases where the permissible vibration error is large (in accordance with the operating mode), the control mode is set so that the target setting ranges are broad. Therefore, unnecessary driving of the actuators can be avoided, so that the unnecessary generation of heat by the actuators can be prevented.

In the situation where the base plate 6 tilts as a result of movement of the XY-stage 20 or reticle stage 27, the three air pressure control circuits 37A through 37C are driven by the non-interference calculating part 56 on the basis of the outputs of the displacement sensors $10Z_1$ through $10Z_3$, so that all or part of the inclination of the base plate 6 caused by the movement of the XY-stage 20 or reticle stage 27 is corrected. Accordingly, even in situations where the operating mode is the exposure mode and the target setting values are set as $X=Y=Z=X\theta=Y\theta=Z\theta=0$, the amount of driving of the actuators 7A through 7D that is required in order to return the base plate 6 to its original attitude can be greatly reduced. Therefore, unnecessary generation of heat by the actuators 7A through 7D can be prevented.

When operating in the alignment operating mode, the amount of inclination is predicted by the target value output part 44 in accordance with the movement command values of the XY-stage 20 prior to the actual initiation of movement by the XY-stage and the target setting values (relating to the inclination of the base plate 6) are set so that the inclination of the base plate 6 agrees with the predicted results. Accordingly, when the XY-stage 20 moves to the position corresponding to the movement command values, there is no need for the control device 11 (first control system) to drive the actuators 7A through 7D or 32A through 32C for the purpose of attitude control (mainly inclination control) of the base plate 6. Instead, only driving for the purpose of vibration control is necessary and the amount of driving of the actuators can be reduced, so that the amount of heat generated is suppressed even further.

Thus, in the present embodiment, by setting the position control command values for the exposure apparatus main body part 40 for each operating mode, it is possible to achieve efficient control of the actuators 7A through 7D and 32A through 32C so that optimal position control response characteristics are obtained. The amount of driving of the vibration isolating pads 4A through 4D, actuators 7A through 7D and 32A through 32C that is required in order to correct the amount of the inclination and suppress vibration can be minimized, so that the effect on the ambient temperature can be minimized.

Additionally, the vibration occurring immediately following the initiation of movement of the reticle stage 27 and immediately prior to the stopping of the reticle stage 27 during scanning exposure can also be suppressed by feeding forward input command values from the scan counter 66.

The present invention is not limited to a step-and-scan type apparatus as described above. The vibration isolator of the present invention can also be applied to exposure projection apparatus such as steppers, or other exposure apparatus in which a moving body, such as a stage, moves across the vibration isolating stand. With steppers, a scan counter is unnecessary because the stages are stopped during exposure.

The present invention is not limited to the suppression of vibration by the exposure apparatus main body in the directions of six degrees of freedom using seven actuators and four vibration isolating pads such an arrangement. It is sufficient if there are at least three Z-direction actuators and three vibration isolating pads for the purpose of correcting the inclination of the base plate (vibration isolating stand).

It will be apparent to those skilled in the art that various modifications and variations can be made in the vibration isolator and exposure apparatus of the present invention without departing from the spirit or scope of the invention. Thus, it is intended that the present invention cover the modifications and variations of this invention provided they come within the scope of the appended claims and their equivalents.

What is claimed is:

1. A vibration isolator which reduces vibrations and inclination generated by a moving body stage, the vibration isolator comprising:

at least three vibration isolating pads;

a vibration isolating stand support held in a substantially horizontal position by the vibration isolating pads;

actuators capable of driving the vibration isolating stand, each of said actuators having a movable member and a stator;

displacement sensors capable of detecting displacement of the vibration isolating stand;

vibration sensors capable of detecting vibration of the vibration isolating stand, said vibration sensors being fixed to the vibration isolating stand;

a control mode unit of the vibration isolating stand capable of selecting a control mode for the vibration isolating stand from a plurality of control modes in which an error tolerance in a control is changed based on an operating mode of the moving body stage; and a first control system, connected to said control mode unit, capable of controlling the actuators based on outputs of the displacement sensors and the vibration sensors in accordance with the selected control mode.

2. The vibration isolator according to claim 1, wherein the control mode unit is capable of operating in a first mode of operation wherein only ranges of target setting values can be altered.

3. The vibration isolator according to claim 2, wherein the control mode is capable of operating in a second mode of operation wherein the target setting values and the ranges of the target setting values are capable of being altered.

4. The vibration isolator according to claim 3, wherein at least three actuators drive the vibration isolating stand in a vertical direction.

5. The vibration isolator according to claim 4, wherein the vibration isolator further includes a second control system that corrects at least a portion of an inclination of the vibration isolating stand occurring as a result of the movement of a moving body stage of an exposure projection apparatus, based on outputs of the displacement sensors.

6. The vibration isolator according to claim 5, wherein the second control system further includes air pressure control circuits that control a flow rate of air supplied to the vibration isolating pads to correct the inclination of the vibration isolating stand, by driving air pressure control circuits based on the outputs of the displacement sensors.

7. The vibration isolator according to claim 6, wherein in the second mode of operation a setting means predicts the amount of inclination of the vibration isolating stand in accordance with movement command values of the moving body stage of an exposure projection apparatus by calculating an amount of inclination of the vibration isolating stand based on a movement position of the moving body stage of the exposure projection apparatus and spring constants of the isolating pads, and sets the target setting values so that the amount of inclination of the vibration isolating stand coincides with the results of the prediction.

8. The vibration isolator according to claim 4, wherein the second mode of operation a setting means predicts an inclination of the vibration isolating stand in accordance with movement command values of the moving body stage of the exposure projection apparatus by calculating the inclination of the vibration isolating stand based on a movement position of the moving body stage of the exposure projection apparatus and spring constants of the isolating pads, and sets the target setting values so that the amount of inclination of the vibration isolating stand coincides with the results of the prediction.

9. The vibration isolator according to claim 3, wherein the second mode of operation, the setting means predicts an inclination of the vibration isolating stand in accordance with movement command values of the moving body stage of the exposure projection apparatus by calculating the amount of inclination of the vibration isolating stand based on a movement position of the moving body stage of an exposure projection apparatus and spring constants of the isolating pads, and sets the target setting values so that the amount of inclination of the vibration isolating stand coincides with the results of the prediction.

10. The vibration isolator according to claim 2, wherein at least three actuators drive the vibration isolating stand in the vertical direction.

11. The vibration isolator according to claim 10, wherein the vibration isolator further includes a second control system that corrects at least a portion of an inclination of the isolating stand occurring as a result of the movement of the moving body stage of the exposure projection apparatus, based on outputs of the displacement sensors.

12. The vibration isolator according to claim 11, wherein the second control system further includes air pressure control circuits that control a flow rate of air supplied to the vibration isolating pads to correct the inclination of the vibration isolating stand by driving air pressure control circuits based on the outputs of the displacement sensors.

13. The vibration isolator according to claim 2, wherein the vibration isolator further includes a second control system that corrects at least a portion of an inclination of the vibration isolating stand occurring as a result of the movement of the moving body stage of the exposure projection apparatus, based on outputs of the displacement sensors.

14. The vibration isolator according to claim 13, wherein the second control system further includes:

air pressure control circuits that control a flow rate of air supplied to the vibration isolating pads to correct the inclination of the isolating stand, by driving the air pressure control circuits based on the outputs of the displacement sensors.

15. The vibration isolator according to claim 1, wherein the control mode unit is capable of operating in a mode of operation wherein target setting values and ranges of target setting values are capable of being altered.

16. The vibration isolator according to claim 15, wherein at least three actuators drive the vibration isolating stand in the vertical direction.

17. The vibration isolator according to claim 16, wherein the vibration isolator further includes:

a second control system which corrects at least a portion of the inclination of the isolating stand, occurring as a result of the movement of a moving body stage of an exposure projection apparatus, based on outputs of the displacement sensors.

18. The vibration isolator according to claim 17, wherein the second control system further includes air pressure control circuits that control a flow rate of air supplied to the vibration isolating pads to correct the inclination of the vibration isolating stand by driving air pressure control circuits based on the outputs of displacement sensors.

19. The vibration isolator according to claim 18, wherein in a second operating mode, the setting means predicts the inclination of the vibration isolating stand in accordance with movement command values of a moving body stage of an exposure projection apparatus by calculating the amount of inclination of the vibration isolating stand based on a movement position of a moving body stage of an exposure projection apparatus and spring constants of the isolating pads, and sets the target setting values so that the amount of inclination of the vibration isolating stand coincides with the results of the prediction.

20. The vibration isolator according to claim 17, wherein in a second operating mode, the setting means predicts an inclination of the vibration isolating stand in accordance with movement command values of a moving body stage of an exposure projection apparatus by calculating the amount of inclination of the vibration isolating stand based on a movement position of a moving body stage of an exposure projection apparatus and spring constants of the isolating pads, and sets the target setting values so that the amount of inclination of the vibration isolating stand coincides with the results of the prediction.

21. The vibration isolator according to claim 16, wherein in a second operating mode, the setting means predicts an inclination of the vibration isolating stand in accordance with movement command values of a moving body stage of an exposure projection apparatus by calculating the inclination of the vibration isolating stand based on a movement position of a moving body stage of an exposure projection apparatus and spring constants of the isolating pads, and sets the target setting values so that the amount of inclination of the vibration isolating stand coincides with the results of the prediction.

22. The vibration isolator according to claim 15, wherein in a second operating mode, the setting means predicts the inclination of the vibration isolating stand in accordance with movement command values of a moving body stage of an exposure projection apparatus by calculating the inclination of the vibration isolating stand based on a movement position of a moving body stage of an exposure projection apparatus and spring constants of the isolating pads, and sets the target setting values so that the amount of inclination of the vibration isolating stand coincides with the results of the prediction.

23. The vibration isolator according to claim 1, wherein at least three actuators drive the vibration isolating stand in the vertical direction.

24. The vibration isolator according to claim 23, wherein the vibration isolator further includes a second control system that corrects at least a portion of an inclination of the isolating stand occurring as a result of the movement of a moving body stage of an exposure projection apparatus, based on outputs of the displacement sensors.

25. The vibration isolator according to claim 24, wherein the second control system further includes air pressure control circuits that control a flow rate of air supplied to the vibration isolating pads to correct the inclination of the vibration isolating stand, by driving the air pressure control circuits based on outputs of displacement sensors.

26. An exposure apparatus which transfers an image of a pattern formed on a mask on a photosensitive substrate by an illuminating light, the exposure apparatus comprising:
   a projection device which has projection system to project the image on the substrate;
   at least three vibration isolating pads;
   a vibration isolating stand support held in a substantially horizontal position by the vibration isolating pads;
   a substrate stage which holds the substrate, said substrate stage movably supported by said vibration isolating stand;
   actuators capable of driving the vibration isolating stand, each of said actuators having a movable member and a stator;
   displacement sensors capable of detecting the displacement of the vibration isolating stand;
   vibration sensors capable of detecting vibration of the vibration isolating stand, said vibration sensors being fixed to the vibration isolating stand;
   a control mode unit of the vibration isolating stand capable of selecting a control mode for the vibration isolating stand from a plurality of control modes in which an error tolerance in a control is changed based on an operating mode of said substrate stage; and
   a control device, connected to said control mode unit, capable of controlling the actuators based on outputs of the displacement sensors and the vibration sensors in accordance with the selected control mode.

27. The exposure apparatus according to claim 26, wherein at least three actuators drive the vibration isolating stand in the vertical direction.

28. The exposure apparatus according to claim 27, wherein the exposure apparatus further includes a second control device that corrects at least a portion of an inclination of the vibration isolating stand occurring as a result of the movement of a moving body stage of the exposure projection apparatus, based on outputs of the displacement sensors.

29. The exposure apparatus according to claim 28, wherein the second control device further includes air pressure control circuits that control a flow rate of air supplied to the vibration isolating pads to correct the inclination of the vibration isolating stand, by driving the air pressure control circuits based on outputs of the displacement sensors.

30. The exposure apparatus according to claim 29, wherein the exposure apparatus further includes a detector capable of detecting marks formed on the photosensitive substrate.

31. The exposure apparatus according to claim 30, wherein the control mode unit includes a first mode of operation wherein an exposure of the photosensitive substrate is performed after the substrate stage is moved so that the photosensitive substrate is positioned in a prescribed exposure position.

32. The exposure apparatus according to claim 31, wherein the control mode unit further includes a second mode of operation wherein the substrate stage is moved and marks are detected by a detector.

33. The exposure apparatus according to claim 32, wherein the operating mode unit further includes a third mode of operation wherein the substrate stage is moved to a prescribed receiving position in order to receive a photosensitive substrate.

34. The exposure apparatus according to claim 26, wherein the control mode unit includes a first mode of operation wherein an exposure of a photosensitive substrate is performed after the substrate stage is moved so that a photosensitive substrate is positioned in a prescribed exposure position.

35. The exposure apparatus according to claim 34, wherein the control mode unit further includes a second mode of operation wherein the substrate stage is moved and marks are detected by the detector.

36. The exposure apparatus according to claim 35, the operating mode unit further includes a third mode of operation wherein the substrate stage is moved to a prescribed receiving position in order to receive the photosensitive substrate.

37. The exposure apparatus according to claim 26, the operating mode unit includes a first mode of operation wherein the substrate stage is moved to a prescribed receiving position in order to receive the photosensitive substrate.

38. A stage apparatus, comprising:
   a stage movable while holding an object;
   a support member that supports the stage so as to be movable;

a driving device that drives the support member, at least a portion of the driving device being installed on the support member; and a controlling device connected to the driving device, the controlling device being capable of controlling the driving device by a plurality of controlling methods in which an error tolerance in a control is changed, the controlling device controlling the driving device by a selected controlling method.

39. The stage apparatus according to claim 38, wherein the plurality of controlling methods in the controlling device includes a controlling mode in which the controlling device does not control the driving device.

40. The stage apparatus according to claim 38, wherein the controlling device controls the driving device so as to reduce vibration conducted to the support member.

41. The stage apparatus according to claim 40, wherein the vibration conducted to the support member is caused by the movement of the stage.

42. The stage apparatus according to claim 38, wherein the controlling device controls the driving device so as to correct changes in attitude of the stage apparatus due to the movement of the stage.

43. The stage apparatus according to claim 38, further comprising a vibration detector that detects vibration conducted to the support member.

44. The stage apparatus according to claim 43, wherein the vibration detector is an acceleration sensor.

45. The stage apparatus according to claim 43, wherein the vibration detector is a displacement sensor.

46. The stage apparatus according to claim 38, further comprising:

a displacement sensor that detects changes in attitude of the stage apparatus.

47. An exposure apparatus for exposing a mask pattern on a mask onto a substrate, comprising:

an exposure main body that exposes the mask pattern onto the substrate, the exposure main body including a mask stage movable while holding the mask and a substrate stage movable while holding the substrate;

a driving device connected to the exposure main body, the driving device driving a mechanical part of the exposure main body that is different from the mask stage and the substrate stage; and a controlling device connected to the driving device, the controlling device being capable of controlling the driving device by a plurality of controlling methods in which an error tolerance in a control is changed, the controlling device controlling the driving device by a selected controlling method.

48. The exposure apparatus according to claim 47, wherein the exposure main body includes a first support part that supports the substrate stage to be movable and a second support part that supports the mask stage to be movable.

49. The exposure apparatus according to claim 48, wherein the driving device drives the first support part.

50. The exposure apparatus according to claim 48, wherein the first support part and the second support part are mechanically connected.

51. The exposure apparatus according to claim 49, wherein the driving device drives the first support part and the second support part.

52. The exposure apparatus according to claim 48, wherein the exposure main body includes a projection system installed between the mask stage and the substrate stage, the projection system projecting the mask pattern onto the substrate.

53. The exposure apparatus according to claim 52, wherein the projection system optically projects the mask pattern onto the substrate.

54. The exposure apparatus according to claim 52, wherein the projection system and the second support part are mechanically connected.

55. The exposure apparatus according to claim 47, wherein the plurality of controlling methods in the controlling device includes a controlling mode in which the controlling device does not control the driving device.

56. The exposure apparatus according to claim 47, wherein the controlling device controls the driving device so as to reduce vibration conducted to the exposure main body.

57. The exposure apparatus according to claim 47, wherein the exposure apparatus is a scanning type exposure apparatus in which the mask pattern is exposed onto the substrate while the mask stage and the substrate stage are moved.

58. A substrate exposed with the mask pattern by the exposure apparatus of claim 47.

59. A method for exposing a mask pattern on a mask onto a substrate in an exposure apparatus, the method comprising the steps of:

providing an exposure apparatus main body, the exposure apparatus main body including a mask stage movable while holding the mask and a substrate stage movable while holding the substrate, the exposure apparatus main body exposing the mask pattern onto the substrate;

providing a drive device connected to the exposure apparatus main body, the drive device driving a mechanical part of the exposure apparatus main body that is different from the mask stage and the substrate stage; and providing a controller connected to the drive device, the controller being capable of controlling the drive device by a plurality of controlling methods in which an error tolerance in a control is changed, the controller controlling the drive device by a selected controlling method.

60. The method according to claim 59, wherein the exposure apparatus main body includes a first support part that supports the substrate stage to be movable and second support part that supports the mask stage to be movable.

61. The method according to claim 60, wherein the first support part and second support part are mechanically connected.

62. The method according to claim 60, wherein the drive device drives the first support part and the second support part.

63. The method according to claim 60, wherein the exposure apparatus main body includes a projection system disposed between the mask stage and the substrate stage, the projection system projecting the mask pattern onto the substrate.

64. The method according to claim 63, wherein the projection system optically projects the mask pattern onto the substrate.

65. The method according to claim 63, wherein the projection system and the second support part are mechanically connected.

66. The method according to claim 59, wherein the exposure apparatus is a scanning type exposure apparatus that exposes the mask pattern onto the substrate while the mask stage and the substrate stage are moved.

* * * * *